(12) United States Patent
Shao et al.

(10) Patent No.: US 11,469,200 B2
(45) Date of Patent: Oct. 11, 2022

(54) SEMICONDUCTOR DEVICE AND MANUFACTURING METHOD THEREOF

(71) Applicant: TAIWAN SEMICONDUCTOR MANUFACTURING COMPANY LTD., Hsinchu (TW)

(72) Inventors: Tung-Liang Shao, Hsinchu (TW); Yu-Chia Lai, Miaoli County (TW); Hsien-Ming Tu, Hsinchu County (TW); Chang-Pin Huang, Taoyuan County (TW); Ching-Jung Yang, Taoyuan County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 1 day.

(21) Appl. No.: 17/107,674

(22) Filed: Nov. 30, 2020

(65) Prior Publication Data

US 2021/0082849 A1    Mar. 18, 2021

Related U.S. Application Data

(60) Continuation of application No. 16/042,317, filed on Jul. 23, 2018, now Pat. No. 10,854,564, which is a
(Continued)

(51) Int. Cl.
*H01L 21/78* (2006.01)
*H01L 21/268* (2006.01)
(Continued)

(52) U.S. Cl.
CPC ............ *H01L 24/11* (2013.01); *H01L 21/268* (2013.01); *H01L 21/561* (2013.01); *H01L 21/78* (2013.01); *H01L 21/784* (2013.01); *H01L 23/3157* (2013.01); *H01L 24/02* (2013.01); *H01L 24/10* (2013.01); *H01L 24/13* (2013.01); *H01L 24/14* (2013.01); *H01L 24/94* (2013.01); *H01L 23/3114* (2013.01); *H01L 23/3192* (2013.01); *H01L 24/03* (2013.01); *H01L 24/05* (2013.01); *H01L 2224/02381* (2013.01); *H01L 2224/0345* (2013.01); *H01L 2224/0346* (2013.01);
(Continued)

(58) Field of Classification Search
CPC ....... H01L 21/78; H01L 21/268; H01L 24/02; H01L 24/03; H01L 24/05; H01L 24/10; H01L 24/11; H01L 24/13; H01L 24/94
USPC .......................................... 257/737
See application file for complete search history.

(56) References Cited

U.S. PATENT DOCUMENTS

| | | | |
|---|---|---|---|
| 2010/0140752 A1* | 6/2010 | Marimuthu | H01L 24/03 257/621 |
| 2014/0264859 A1* | 9/2014 | Chen | H01L 24/02 257/738 |
| 2015/0061079 A1* | 3/2015 | Chen | H01L 21/56 257/620 |

* cited by examiner

*Primary Examiner* — Fazli Erdem
(74) *Attorney, Agent, or Firm* — WPAT, P.C., Intellectual Property Attorneys; Anthony King

(57) ABSTRACT

A semiconductor device includes a substrate includes a first layer and a second layer over the first layer, a bump disposed over the second layer, a molding disposed over the second layer and surrounding the bump, and a retainer disposed over the second layer, wherein the retainer is disposed between the molding and a periphery of the substrate. Further, a method of manufacturing a semiconductor device includes providing a substrate, disposing several bumps on the substrate, disposing a retainer on the substrate and surrounding the bumps, and disposing a molding between the bumps and the retainer.

20 Claims, 29 Drawing Sheets

Related U.S. Application Data division of application No. 15/257,573, filed on Sep. 6, 2016, now Pat. No. 10,032,737, which is a continuation of application No. 14/181,912, filed on Feb. 17, 2014, now Pat. No. 9,484,318.

(51) Int. Cl.
*H01L 23/00* (2006.01)
*H01L 23/31* (2006.01)
*H01L 21/56* (2006.01)
*H01L 21/784* (2006.01)

(52) U.S. Cl.
CPC ............... *H01L 2224/03452* (2013.01); *H01L 2224/0401* (2013.01); *H01L 2224/05548* (2013.01); *H01L 2224/05647* (2013.01); *H01L 2224/05655* (2013.01); *H01L 2224/05666* (2013.01); *H01L 2224/10126* (2013.01); *H01L 2224/10145* (2013.01); *H01L 2224/11013* (2013.01); *H01L 2224/1182* (2013.01); *H01L 2224/11334* (2013.01); *H01L 2224/13014* (2013.01); *H01L 2224/13016* (2013.01); *H01L 2224/13023* (2013.01); *H01L 2224/13024* (2013.01); *H01L 2224/13027* (2013.01); *H01L 2224/13111* (2013.01); *H01L 2224/94* (2013.01); *H01L 2924/12042* (2013.01); *H01L 2924/181* (2013.01); *H01L 2924/3511* (2013.01)

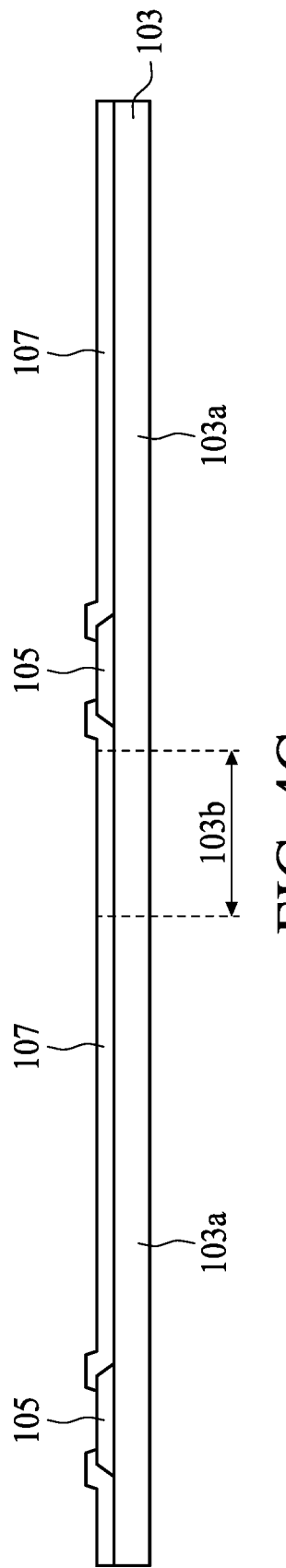

SEMICONDUCTOR DEVICE AND MANUFACTURING METHOD THEREOF

CROSS-REFERENCE TO RELATED APPLICATIONS

This application is a continuation of U.S. application Ser. No. 16/042,317, filed Jul. 23, 2018, which is a division of U.S. application Ser. No. 15/257,573, filed Sep. 6, 2016, which is a continuation of U.S. application Ser. No. 14/181,912, filed Feb. 17, 2014. All of the above-referenced applications are hereby incorporated herein by reference in their entirety.

BACKGROUND

Electronic equipment using semiconductor devices are essential for many modern applications. With the advancement of electronic technology, electronic equipment is becoming increasingly smaller in size and complicated in structure and functionality. Wafer level packaging (WLP) technology has been gaining popularity and is widely applied. This technology provides a wafer level manufacturing of semiconductor devices with high functions and complicated structures while the size of the semiconductor devices is minimized.

The WLP technology is widely adopted for assembling and combining a number of semiconductor components to become a semiconductor device so as to minimize the final size of the semiconductor device as well as the electronic equipment. During assembly operations, the semiconductor device is sawed and singulated from a wafer by a mechanical or laser blade. The semiconductor device is individualized for subsequent assembly operations. However, the semiconductor device includes many semiconductor components with complicated structures. The singulation operations involve many complicated manufacturing processes and as such, the semiconductor device is easily damaged during the singulation operations.

The sawing operations on the wafer is complicated because it involves numerous operations, and such operations that are applied on the small semiconductor device include many different kinds of materials with different properties. The differences between materials would increase the complexity of manufacturing the semiconductor devices and may also increase yield loss. This could result in poor bondability between components, and cracking or delamination of the components.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4C is a schematic view of a passivation layer formed on a semiconductor wafer for structural support and physical isolation in accordance with some embodiments.

DETAILED DESCRIPTION

Figure 1A:
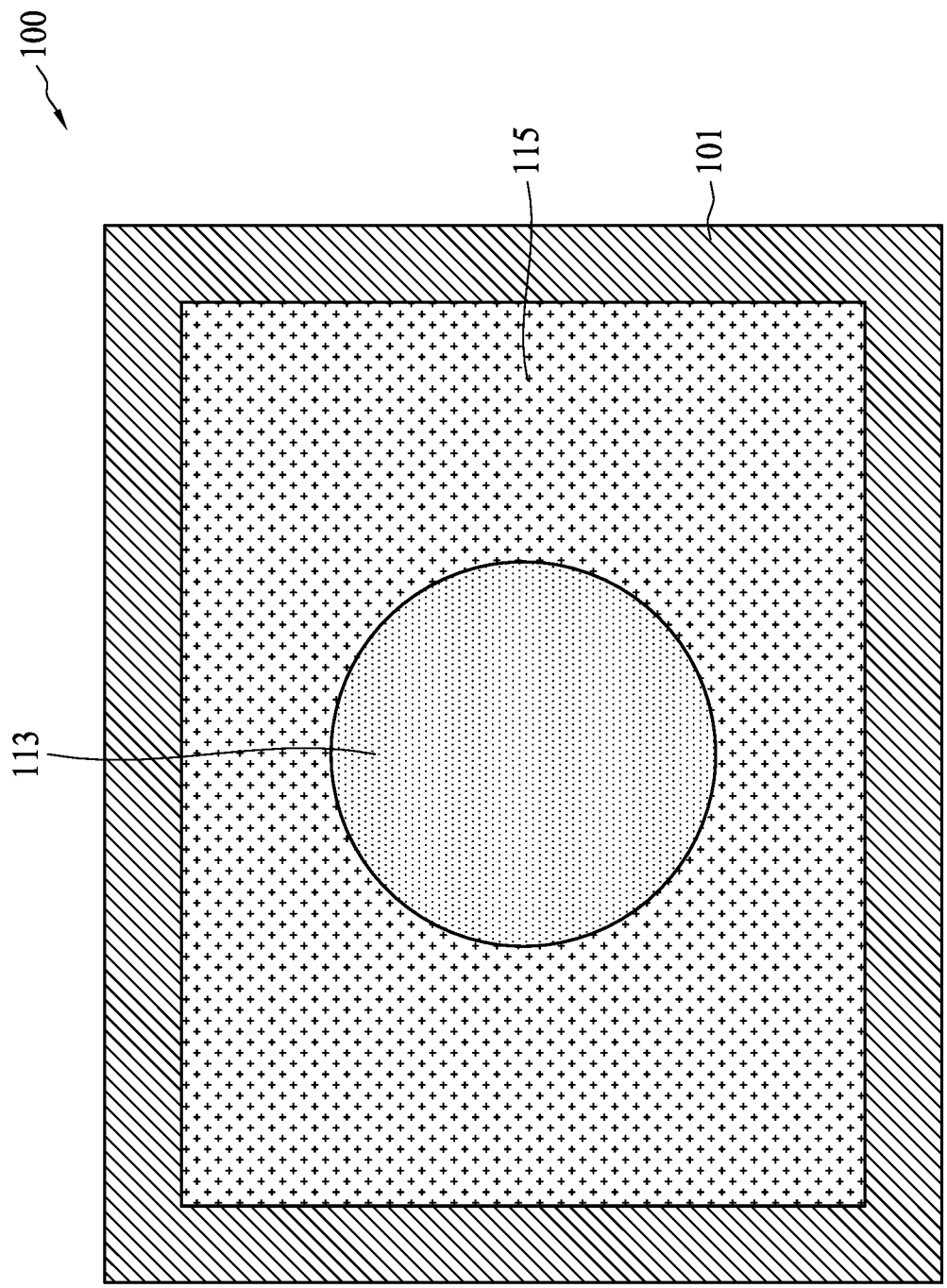
FIG. 1A illustrates a top view of an embodiment of a semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
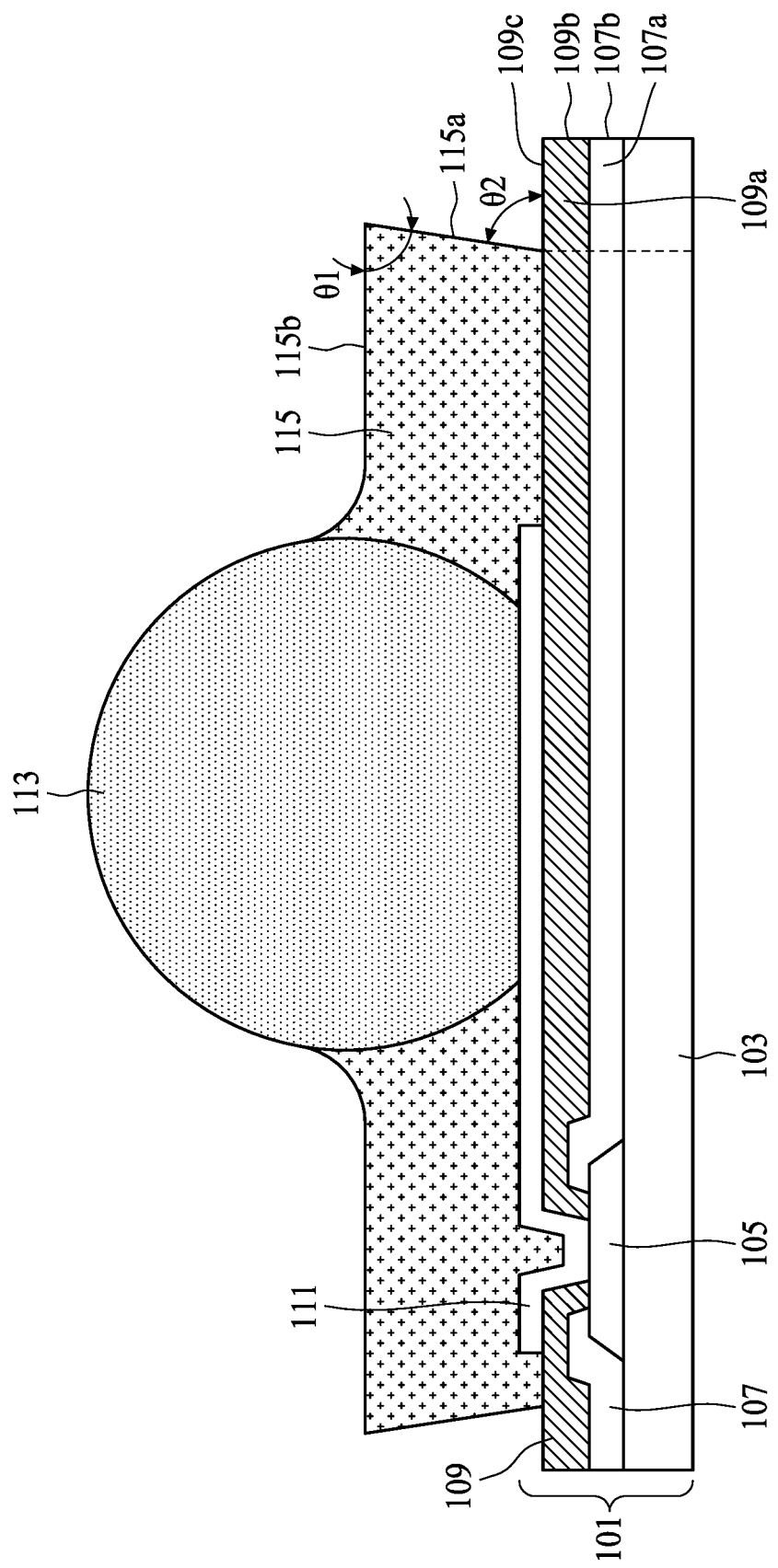
FIG. 1B illustrates a cross-sectional view of an embodiment of a semiconductor device in accordance with some embodiments.

FIG. 1A and FIG. 1B respectively illustrate a top view and a cross-sectional view of an embodiment of a semiconductor device 100. In some embodiments, the semiconductor device 100 includes a substrate 101 with a first layer 107 and a second layer 109 over the first layer 107, a bump 113 disposed over the second layer 109 of the substrate 101, and a molding 115 disposed over the second layer 109 of the substrate 101, wherein the molding 115 surrounds the bump 113.

The substrate 101 includes a semiconductor wafer 103 such as a silicon wafer, a semiconductor-on-insulator (SOI) wafer, or any construction comprising semiconductor materials. In some embodiments, the semiconductor wafer 103 includes integrated circuits (IC) or semiconductor components such as transistors, capacitors, resistors, diodes, photodiodes, fuses, and the like configured to perform one or more functions that are formed at the surface of the semiconductor wafer. The IC and semiconductor components are not shown in this illustration.

In some embodiments, a conductive contact pad 105 is disposed on the semiconductor wafer 103. In some embodiments, the semiconductor device 100 has several contact pads 105 on an upper surface thereof. In some embodiments, the contact pad 105 is made with aluminum (Al), copper (Cu), tin (Sn), nickel (Ni), gold (Au), silver (Ag), or other electrically conductive materials. The size, shape, and location of the contact pad 105 are only for illustrative purposes and are not limiting. The pads 105 of the substrate 101, which are not shown, may be of the same size or of different sizes.

In some embodiments, the first layer 107 is a passivation layer disposed on the surface of the semiconductor wafer 103 for structural support and physical isolation. In some embodiments, the passivation layer 107 is made of silicon nitride (SiN), silicon dioxide ($SiO_2$), silicon oxynitride (SiON), polyimide (PI), benzocyclobutene (BCB), polybenzoxazole (PBO), or other insulating materials. An opening of the passivation layer 107 is formed by removing a portion of the passivation layer 107 to expose a portion of the contact pad 105 while still covering the other portion of the contact pad 105. The size, shape, and location of the opening that is made are only for illustrative purposes and are not limiting.

In some embodiments, the second layer 109 is a polymer layer disposed on the passivation layer 107, thereby filling a part of the opening of the passivation layer 107 over the contact pad 105. In some embodiments, the polymer layer 109 is formed of a polymer, such as an epoxy, polyimide, benzocyclobutene (BCB), polybenzoxazole (PBO), and the like. However, other relatively soft, often organic, dielectric materials can also be used. The dimensions recited throughout the description are merely examples, and will change with the down-scaling of integrated circuits.

In some embodiments, a metal material is used to form a redistribution layer (RDL) or post-passivation interconnect (PPI) 111 on the polymer layer 109. In some embodiments, the post-passivation interconnect 111 is made with, for example, Ti, Al, Ni, nickel vanadium (NiV), Cu, or a Cu alloy. In some embodiments, the substrate 101 includes a number of post-passivation interconnects 111 so as to form a network, which electrically connects to the contact pads 105 according to the function of the semiconductor device.

In some embodiments, the bump 113 is mount onto the post-passivation interconnect 111. In some embodiments, the substrate 101 includes a number of post-passivation interconnects 111, and the semiconductor device 100 has some bumps 113 disposed respectively onto the post-passivation interconnects 111. In some embodiments, the bump 113 is among an array of solder balls formed as a grid, referred to as a "ball grid array" or "BGA". However, the embodiments described herein are not limited to BGA packages or BGA balls. The embodiments are not limited to the spherical or ball shapes for the solder connectors.

In some embodiments, the bump 113 includes lead-free solders, including tin, copper, and silver, or "SAC" compositions, and other eutectics that have a common melting point and form conductive solder connections in electrical applications. For lead-free solders, SAC solders of varying compositions may be used, such as SAC 105 (Sn 98.5%, Ag 1.0%, Cu 0.5%), SAC 305, SAC 405 and the like. Lead-free solders, such as solder balls, may be formed from SnCu compounds as well, without the use of silver (Ag).

In some embodiments, the semiconductor device 100 has several bumps 113 with the molding 115 disposed between the bumps 113. In some embodiments, the molding 115 includes a molding compound, which can be a single layer film or a composite stack. In some embodiments, the molding compound includes various materials, for example, one or more of epoxy resins, phenolic hardeners, silicas, catalysts, pigments, mold release agents, and the like.

Referring to FIG. 1B, in some embodiments, the molding 115 has an inclined sidewall 115a adjacent to a periphery of the substrate 101, and the second layer 109 includes a protruded portion 109a protruding from the sidewall 115a of the molding 115. Consequently, the upper surface 109c of the second layer 109 is not completely covered by the molding 115. In some embodiments, the protruded portion 109a has a sidewall 109b not aligned with the sidewall 115a of the molding 115, thereby forming a stepped configuration. In some embodiments, the first layer 107 also includes a protruded portion 107a protruding from the sidewall 115a. In some embodiments, the protruded portion 107a has a sidewall 107b aligned with the sidewall 109b of the second layer 109. In some embodiments, an included angle θ1 of the sidewall 115a and the upper surface 115b of the molding 115 is smaller than ninety degrees. In some embodiments, an included angle θ2 of the sidewall 115a and the upper surface 109c of the second layer 109 is smaller than ninety degrees.

Figure 2A:
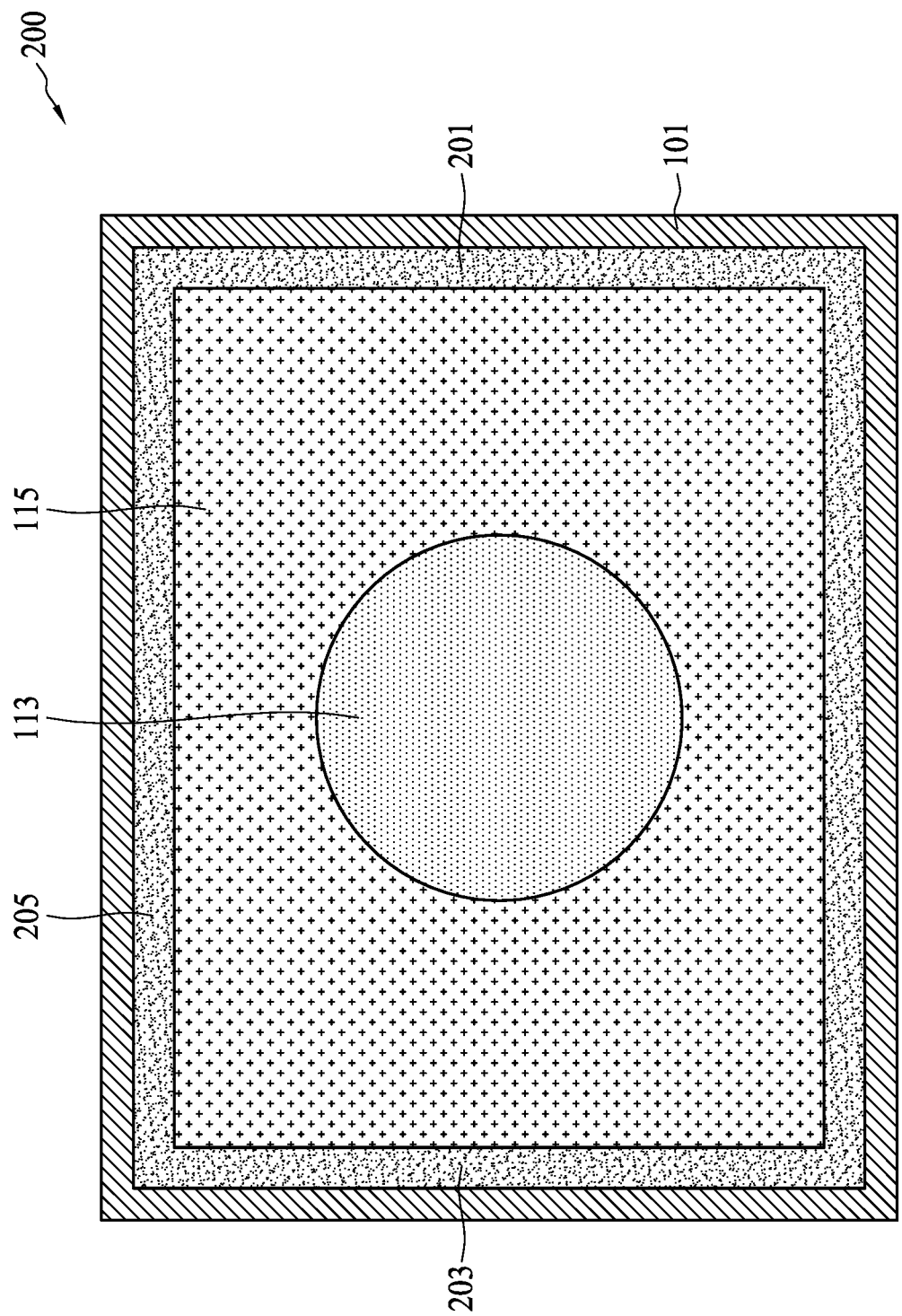
FIG. 2A illustrates a top view of an embodiment of a semiconductor device in accordance with some embodiments.
Figure 2B:
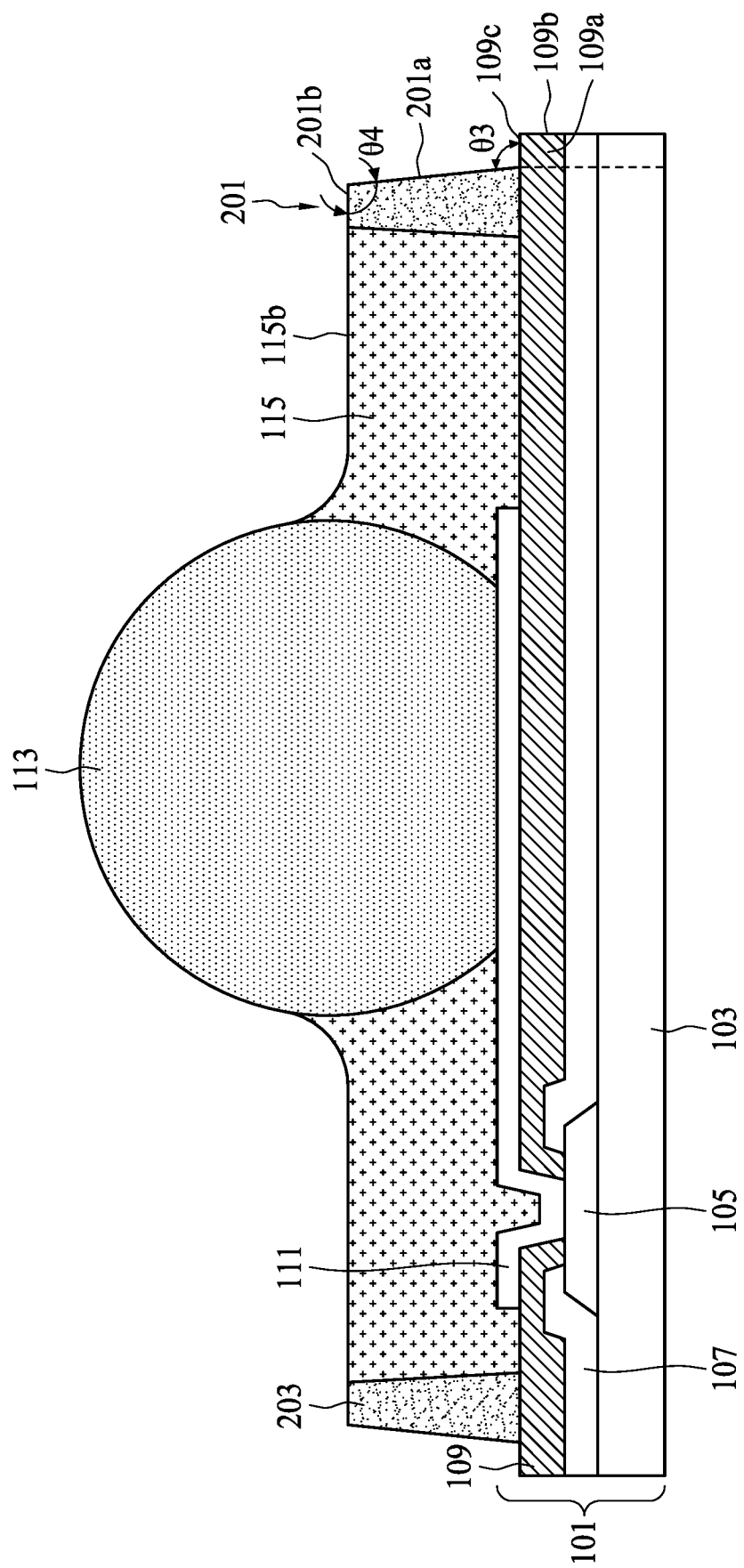
FIG. 2B illustrates a cross-sectional view of an embodiment of a semiconductor device in accordance with some embodiments.

FIG. 2A and FIG. 2B respectively illustrate a top view and a cross-sectional view of an embodiment of a semiconductor device 200. Compared to the semiconductor device 100 shown in FIG. 1A, the semiconductor device 200 further includes a retainer 201 disposed over the second layer 109 of the substrate 101, wherein the retainer 201 is disposed between the molding 115 and the peripheral of the substrate 101. In some embodiments, the retainer 201 includes some blocking walls 203 adjacent to the periphery of the substrate 101, and the blocking walls separate the molding 115 from the periphery of the substrate 101. In some embodiments, the retainer 201 is a ring 205 that separates the molding 115 from the peripheral of the substrate 101; in addition, the ring 205 surrounds the molding 115.

In some embodiments, the retainer 201 is formed of materials different from the molding compound material. During the molding operation, the retainer 201 breaks the molding 115 that would otherwise form as a continuous matrix of the molding compound material. Preferably, the retainer 201 formed of stress relief materials can further release the stress of the molding, in addition to breaking the molding. In some embodiments, the retainer 201 is made of a photoresist, silicon nitride (SiN), silicon dioxide ($SiO_2$), or silicon oxynitride (SiON).

Referring to FIG. 2B, in some embodiments, the protruded portion 109b of the second layer 109 protrudes from a sidewall 201a of the retainer 201 adjacent to the periphery of the substrate 101. Therefore, the upper surface 109c of the second layer 109 is not completely covered by the molding 115. In some embodiments, the sidewall 201a of the retainer 201 is not aligned with the sidewall 109b of the second layer 109, thereby forming a stepped configuration. In some embodiments, a top end of the retainer 201 is lower than or equal to a top end of the bump 113.

In some embodiments, the retainer 201 has a trapezoidal cross-section. The sidewall 201a of the retainer 201 is an inclined sidewall adjacent to the periphery of the substrate 101. The width of the retainer 201 at the upper end is smaller than that of at the bottom end. In some embodiments, an included angle θ3 of the sidewall 201a of the retainer 201 and an upper surface 109c of the second layer 109 is larger than ninety degrees. In some embodiments, an included angle θ4 of the sidewall 201a of the retainer 201 and the upper surface 201b of the retainer 201 is larger than ninety degrees.

Figure 3:
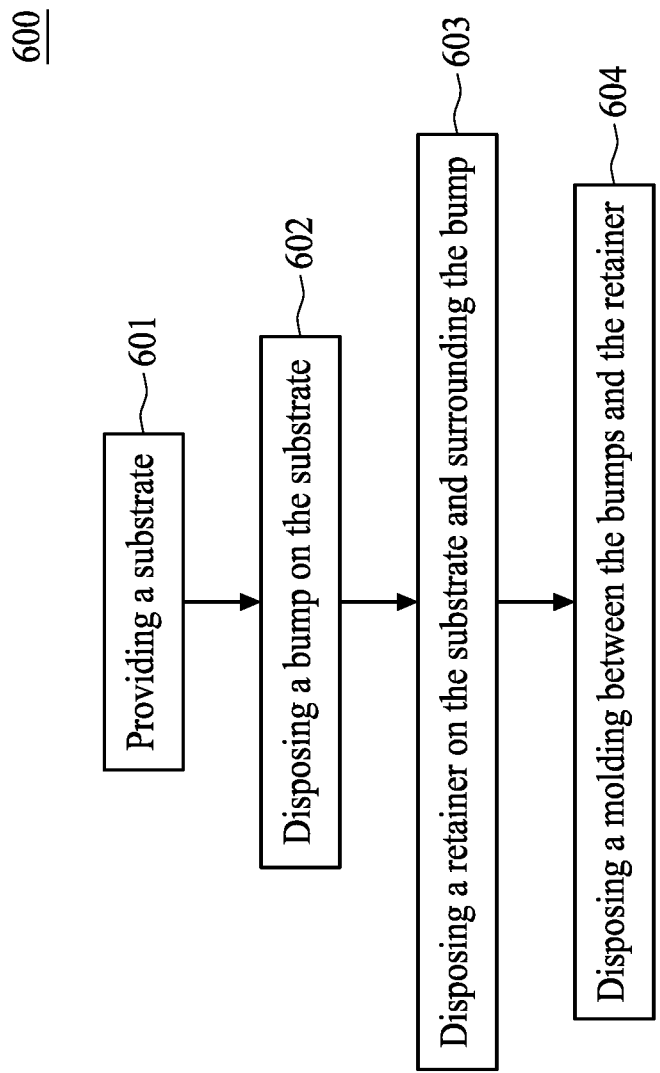
FIG. 3 is a flow chart of a method for manufacturing a semiconductor device in accordance with some embodiments.

FIG. 3 is a flow chart of a method 600 for manufacturing the semiconductor device 100 shown in FIG. 1B or the semiconductor device 200 shown in FIG. 2B in accordance with some embodiments. The method 600 begins in operation 601 where a substrate is provided for disposing bumps. Then, a bump is disposed on the substrate in operation 602. Subsequently, a retainer is disposed on the substrate to surround the bump in operation 603. In operation 604, a molding is disposed between the bump and the retainer, wherein the molding surrounds the bump, and the retainer surrounds the molding.

Figure 4:
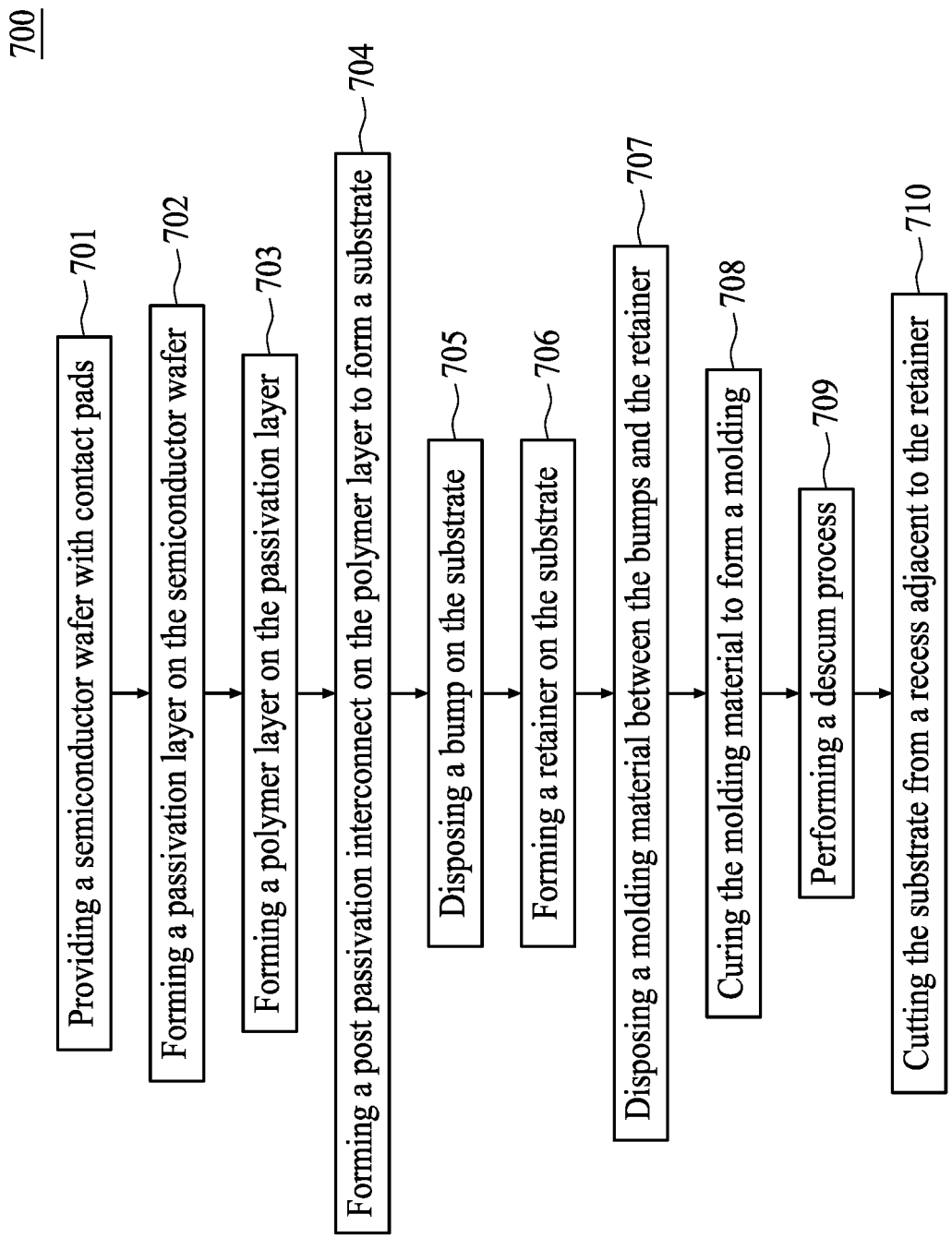
FIG. 4 is a flow chart of a method for manufacturing a semiconductor device in finer detail in accordance with some embodiments.

FIG. 4 is a flow chart of a method 700 for manufacturing the semiconductor device 200 shown in FIG. 2A in accordance with some embodiments. The method 700 includes a number of operations (701, 702, 703, 704, 705, 706, 707, 708, 709, 710).

Figure 4A:
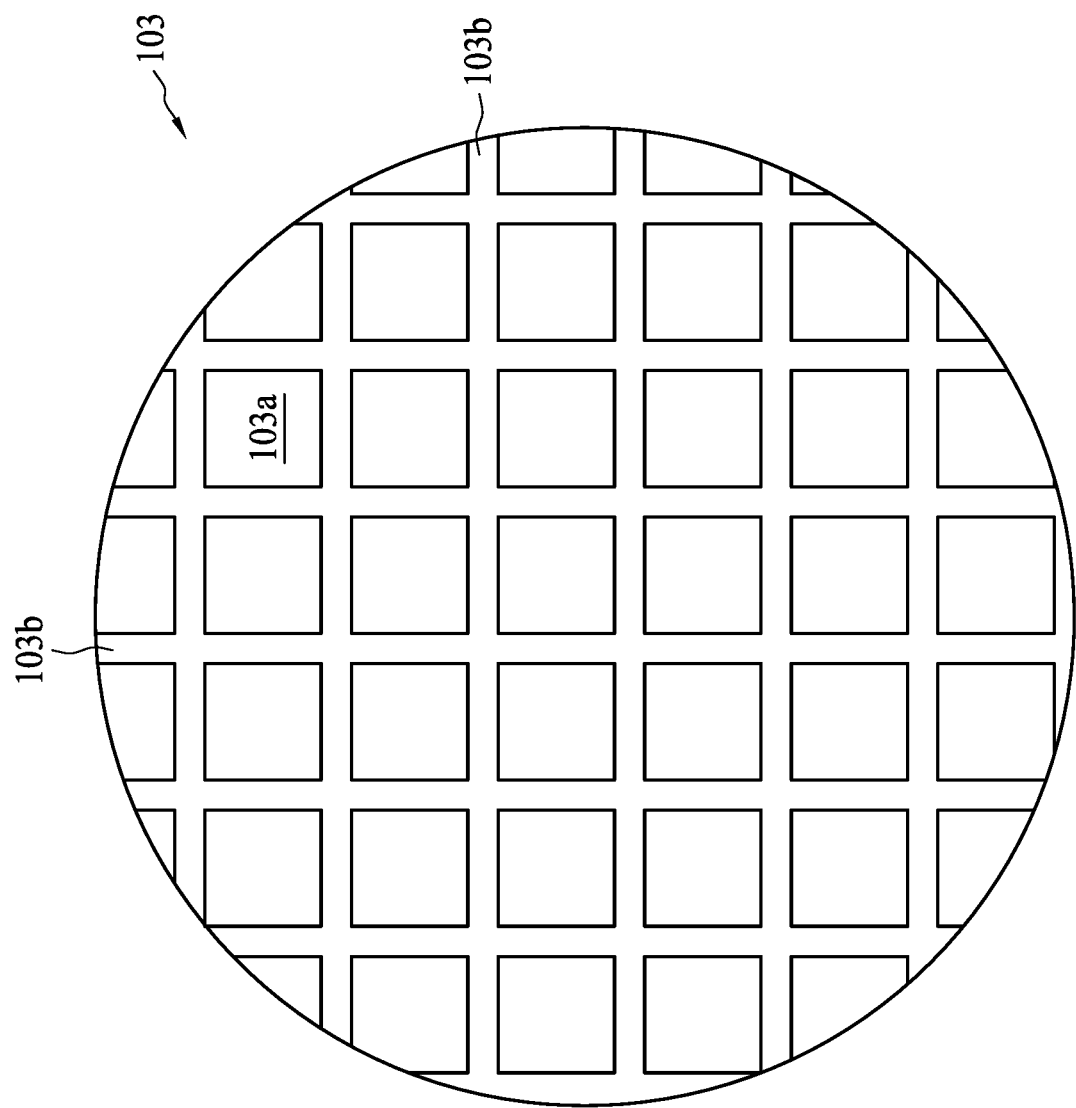
FIG. 4A is a top view of a semiconductor wafer with dies separated by scribe lines in accordance with some embodiments.

In operation 701, a semiconductor wafer 103 is provided as shown in FIG. 4A, which is a top view of the semiconductor wafer 103 with dies (or circuit regions) 103a separated by scribe lines 103b in accordance with some embodiments. In some embodiments, the semiconductor wafer 103 includes an array of dies 103a separated from each other by two sets of intersecting scribe lines 103b. One set of scribe lines 103b extend along a first direction and another set of scribe lines 103b extend along a second direction.

Figure 4B:
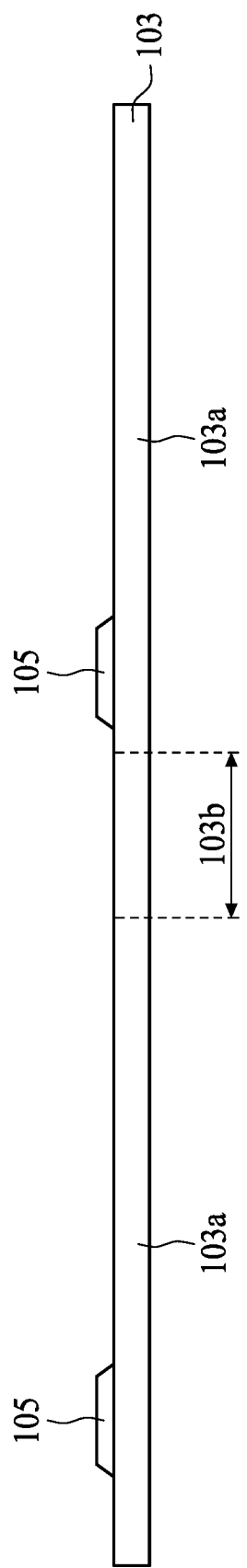
FIG. 4B is a cross-sectional view of two adjacent dies separated by scribe lines in FIG. 4A in accordance with some embodiments.

FIG. 4B is a cross-sectional view showing two adjacent dies 103a separated by scribe lines 103b in FIG. 4A. In some embodiments, the semiconductor wafer 103 has several contact pads 105 on an upper surface thereof. The contact pad 105 is formed by deposition operation such as an electrolytic plating or electroless plating process. In some embodiments, the contact pad 105 has various plating treatments to increase adhesion, provide diffusion barriers, prevent oxidation, and increase solderability.

Referring to FIG. 4C, in operation 702, a passivation layer 107 is formed on the semiconductor wafer 103 and on top of the contact pad 105 for structural support and physical isolation. In some embodiments, the passivation layer 56 is formed by a chemical vapor deposition (CVD) process. An opening of the passivation layer 107 is made by removing a portion of passivation layer 107 using a mask-defined photoresist etching process to expose a portion of the contact pad 105.

Figure 4D:
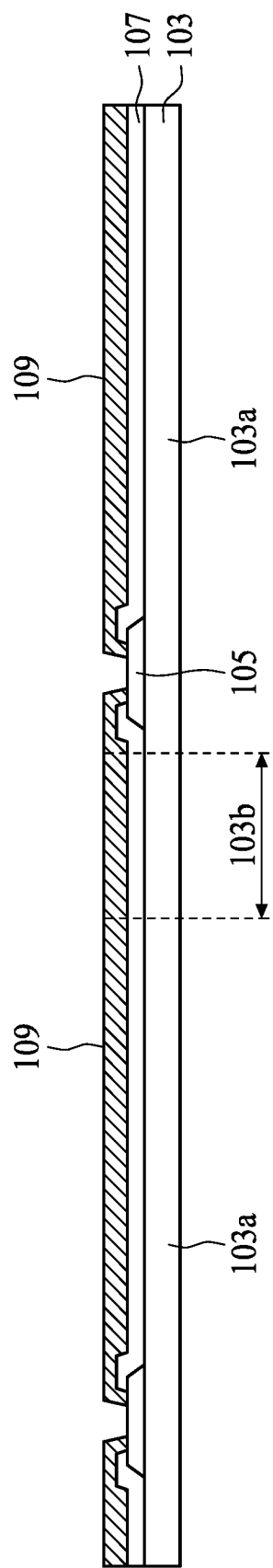
FIG. 4D is a schematic view of a polymer layer formed on a passivation layer in accordance with some embodiments.

Referring to FIG. 4D, in operation 703, a polymer layer 109 is formed on the passivation layer 107, following the contour of the passivation layer 107, thereby filling a part of the opening of the passivation layer 107 over the contact pad 105. The polymer layer 109 does not completely fill the opening of the passivation layer 107 over the contact pad 105. Instead, the polymer layer 109 is patterned to form an opening to expose a part of the contact pad 105, while covering the rest of the contact pad 105. The patterning of the polymer layer 109 may include photolithography operations. Formation methods of the polymer layer 109 include spin coating or other commonly used methods.

Figure 4E:
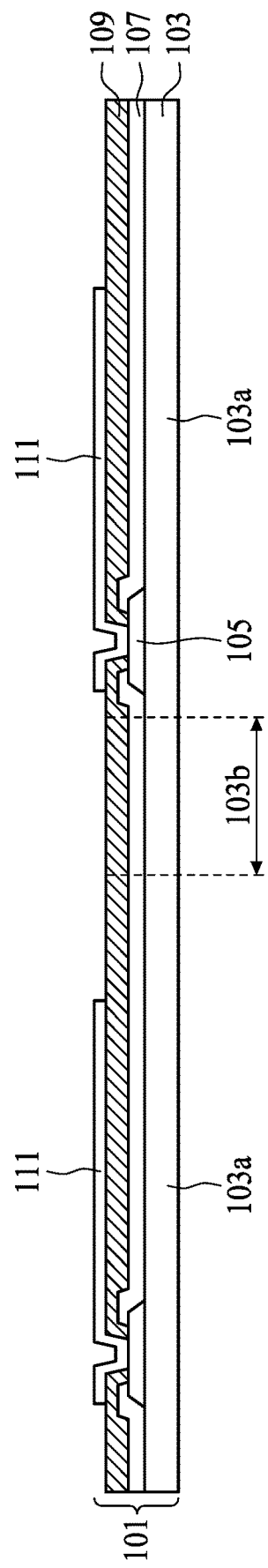
FIG. 4E is a schematic view of a metal material used to form a redistribution layer (RDL) or post-passivation interconnect (PPI) on the polymer layer to form a substrate 101 in accordance with some embodiments.

Referring to FIG. 4E, in operation 704, a metal material is used to form a redistribution layer (RDL) or post-passivation interconnect (PPI) 111 on the polymer layer 109 to form a substrate 101, wherein the post-passivation interconnect (PPI) 111 follows the contour of the polymer layer 109. In some embodiments, a number of post-passivation interconnects 111 are formed on the polymer layer 109 so as to form a network, which electrically connects to the contact pads 105 according to the function of the semiconductor device. In some embodiments, the formation methods of the post-passivation interconnect (PPI) 111 include electrolytic plating, electroless plating, sputtering, chemical vapor deposition methods, and the like.

Figure 4F:
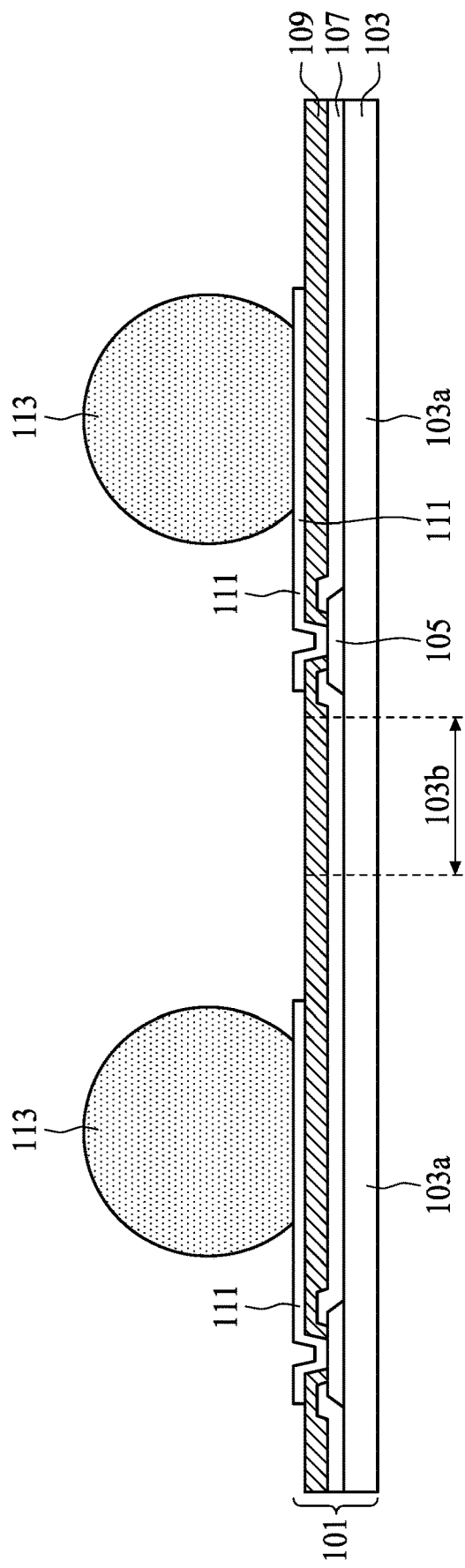
FIG. 4F is a schematic view of bumps disposed onto a post-passivation interconnect in accordance with some embodiments.

Referring to FIG. 4F, in operation 705, a bump 113 is mount onto the post-passivation interconnect 111. In some embodiments, a number of post-passivation interconnects 111 are formed on the polymer layer 109 so as to form a network, and several bumps 113 are formed respectively onto the post-passivation interconnects 111. In some embodiments, the bump 113 is one among an array of the solder balls formed as a grid, referred to as a "ball grid array" or "BGA".

Figure 4G:
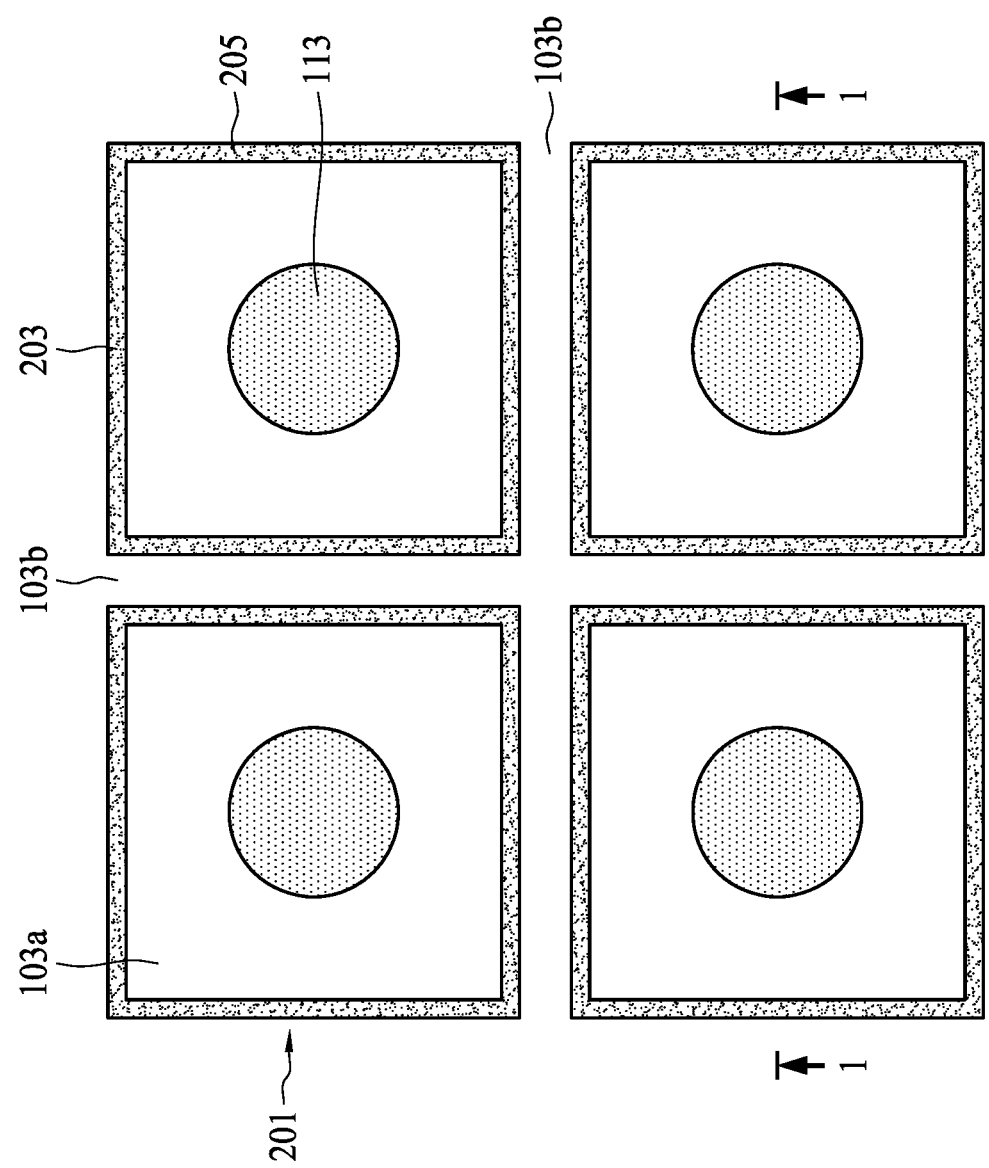
FIG. 4G is a top view of a retainer formed on a substrate in accordance with some embodiments.
Figure 4H:
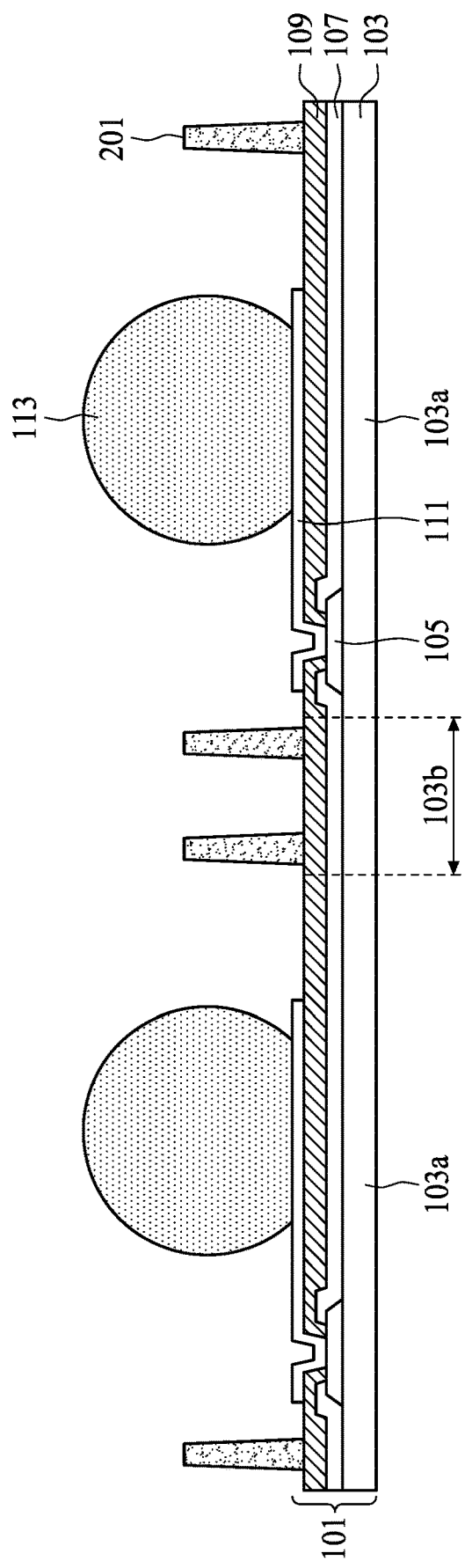
FIG. 4H is a cross-sectional view along a cross-sectional line 1-1 in FIG. 4G in accordance with some embodiments.

FIG. 4G is a top view showing four adjacent dies 103a separated by scribe lines 103b in FIG. 4A, and FIG. 4H is a cross-sectional view along a cross-sectional line 1-1 in FIG. 4G. Referring to FIG. 4G and FIG. 4H, in operation 706, a retainer 201 is formed on the substrate 101. In some embodiments, a mask-defined photoresist etching process is used to form the retainer 201 including several blocking rings 205 on the polymer layer 109 of the substrate 101, wherein the retainer 201 surrounds the bump 113. In some embodiments, the mask-defined photoresist etching process includes a resist-coating process, a baking process to drive out the volatile compounds in the resist and solidifying the resist, and a developing process to strip the non-solidified resist.

In some embodiments, the retainer 201 is formed of stress relief materials, which is different from the molding compound material. During the molding operation, the retainer 201 breaks the molding 115 that would otherwise form as a continuous matrix of the molding compound material. Preferably, the retainer 201 formed of stress relief materials can further release the stress of the molding, in addition to breaking the In some embodiments, the blocking rings 205 are separated from each other. In some embodiments, the blocking ring 205 includes several blocking walls 203 on the scribe line 103b, and the blocking wall 203 separates the bump 113 from the periphery of the substrate 101. In some embodiments, the width of the blocking wall 203 is smaller than the width of the scribe line 103b. In some embodiments, the top end of the blocking wall 203 is lower than or equal to the top end of the bump 113.

Figure 4I:
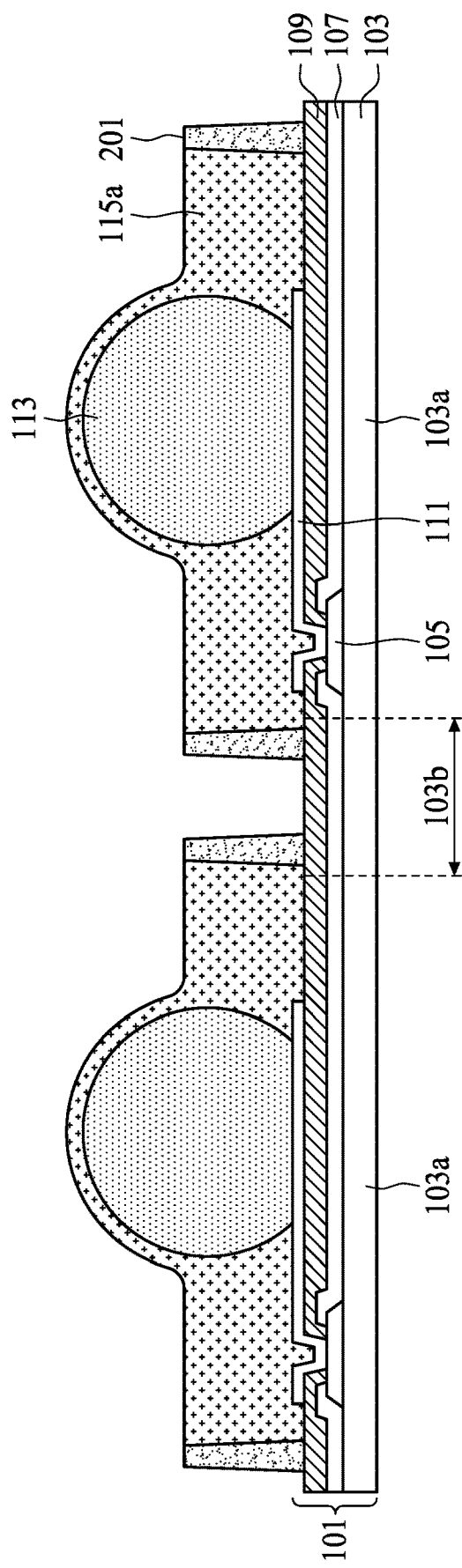
FIG. 4I is a schematic view of a liquid molding material dispensed on a substrate in accordance with some embodiments.

Referring to FIG. 4I, in operation 707, a liquid molding material 115a is dispensed on the substrate 101. In some embodiments, the liquid molding material 115a is an underfill that flows beneath the bump 113 by capillary action. In some embodiments, the liquid molding compound 115a is dispersed inside the blocking rings 205 and surrounds the bump 113. In some embodiments, the semiconductor device 200 has several bumps 113, and the liquid molding compound 115a is disposed between the bumps 113. In some embodiments, the liquid molding compound 115a includes various materials, for example, one or more of epoxy resins, phenolic hardeners, silicas, catalysts, pigments, mold release agents, and the like.

Figure 4J:
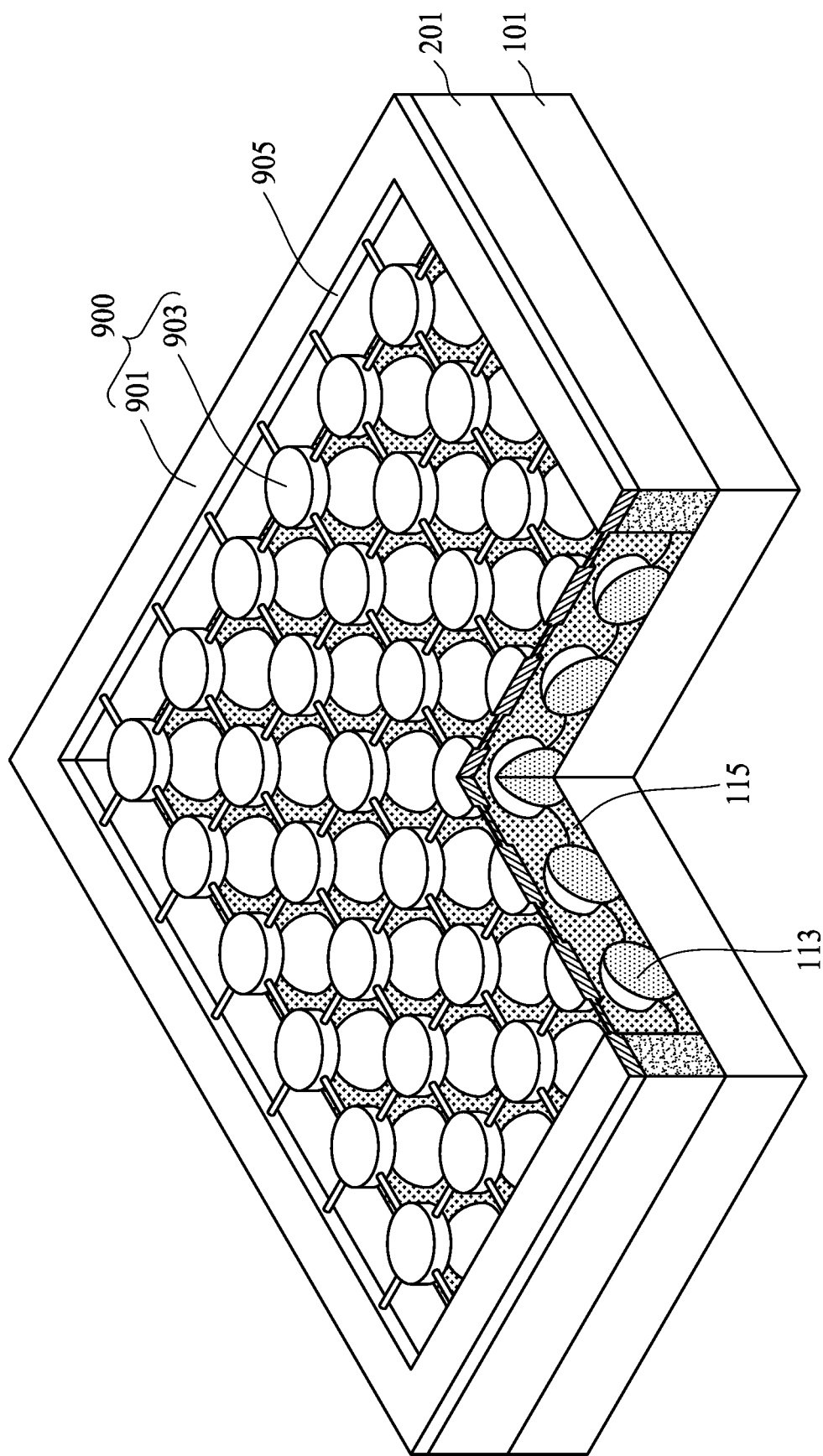
FIG. 4J is a schematic view of a liquid molding material dispensed on a substrate by screen printing in accordance with some embodiments.

Referring to FIG. 4J, in some embodiments, the liquid molding material 115a is dispensed on the substrate 101 by screen printing. In some embodiments, the screen printing uses a stencil mask 900 including a frame 901 and several circular patterns 903 surrounding several openings 905. After the formation of the retainer 201, the stencil mask 900 is aligned with the substrate 101, and the liquid molding material 115a is squeegeed through the apertures 905 of the stencil mask 900 and onto the interior of the retainer 201, thereby printing the liquid molding material 115a onto the substrate 101. In the screen printing, the frame 901 is aligned with the retainer 201, and the circular patterns 903 are aligned with the bumps 113.

In some embodiments, the top end of the retainer 201 is lower than or equal to the top end of the bump 113. If there is too much liquid molding material 115a disposed inside the blocking rings 205 of the retainer 201, the top end of the liquid molding material 115a is higher than the top end of the retainer 201. To lower the top end of the liquid molding material 115a, a compression process is performed to compress the top end of the liquid molding material 115a so as to remove a portion of the liquid molding material 115a above the top end of the retainer 201.

Figure 4K:
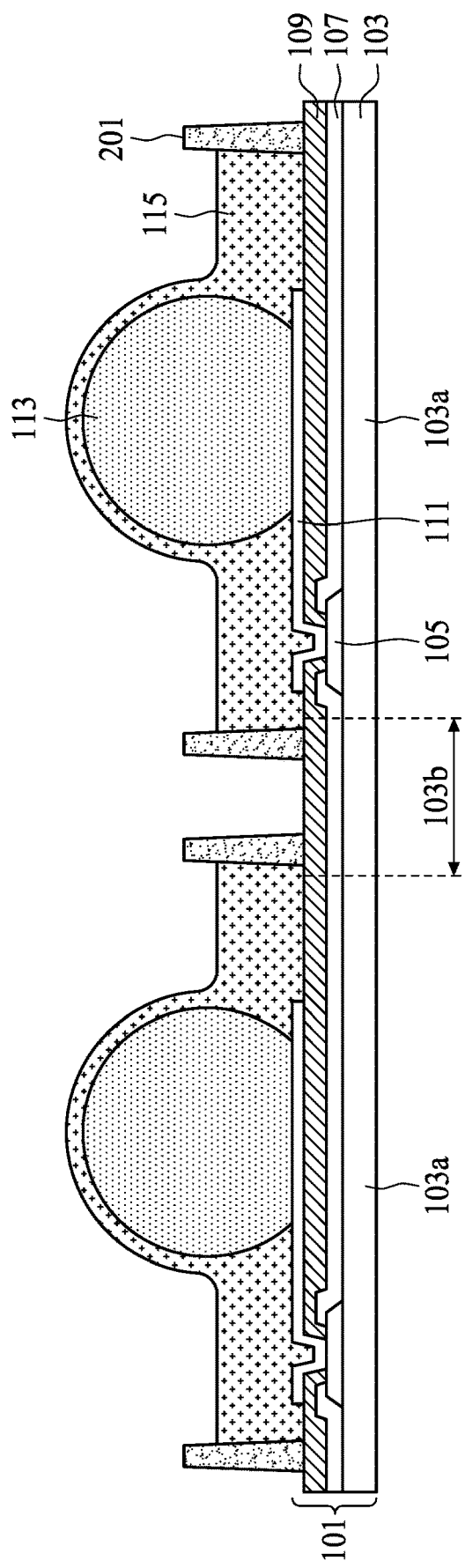
FIG. 4K is a schematic view of a curing process performed to drive out volatile compounds in a liquid molding material in accordance with some embodiments.

Referring to FIG. 4K, in operation 708, a curing process is performed to drive out the volatile compounds, such as moisture or other organic compounds with low evaporation temperature, in the liquid molding material 115a, so as to convert the liquid molding material 115a into a solid and supportive molding 115. In some embodiments, the curing operation is performed at a temperature in a range from about 200° C. to about 250° C. In some other embodiments, the curing temperature is in a range from about 130° C. to about 180° C. The duration of the curing process is in a range from about 1 minute to about 10 minutes, in accordance with some embodiments.

Figure 4L:
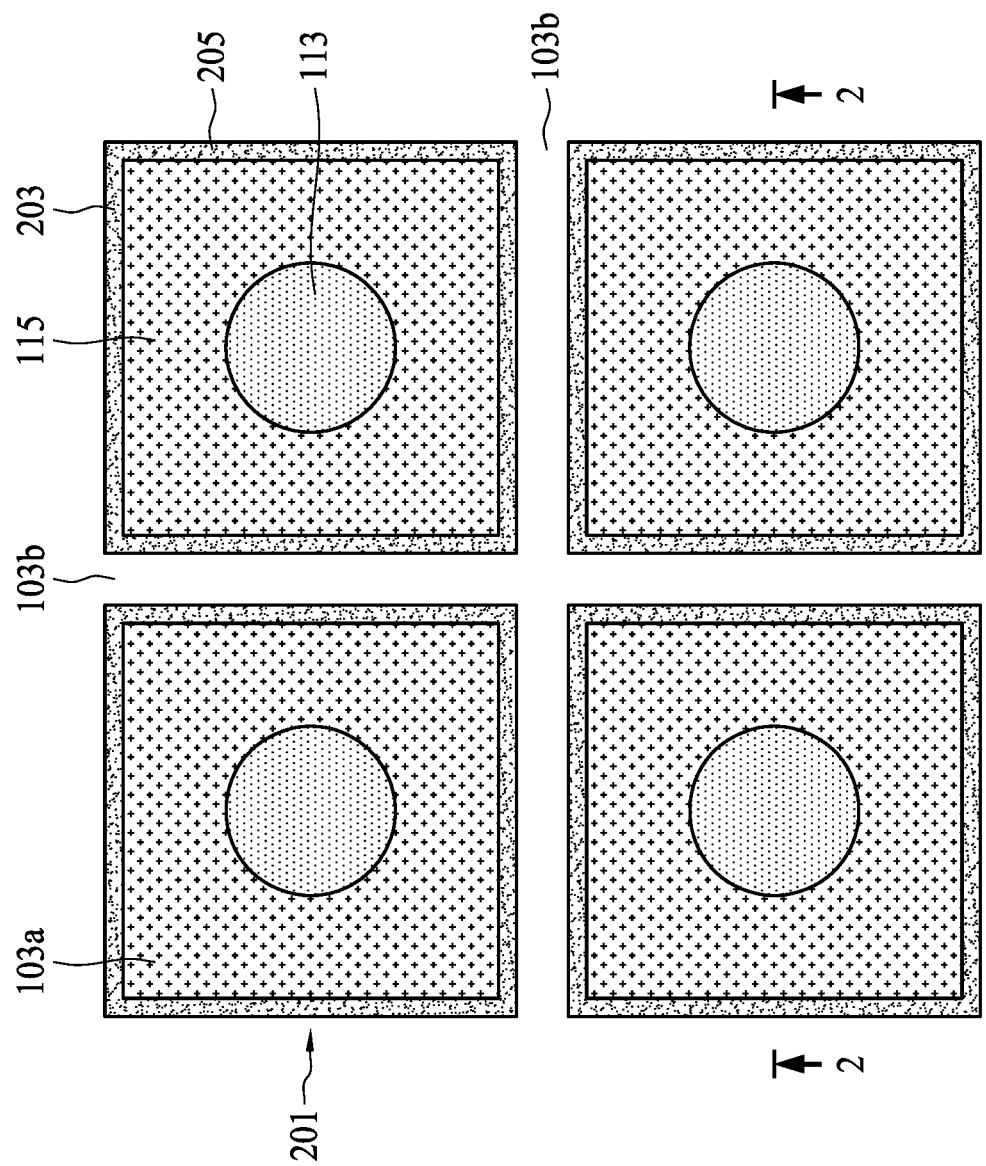
FIG. 4L is a top view of four adjacent dies separated by scribe lines in FIG. 4A in accordance with some embodiments.
Figure 4M:
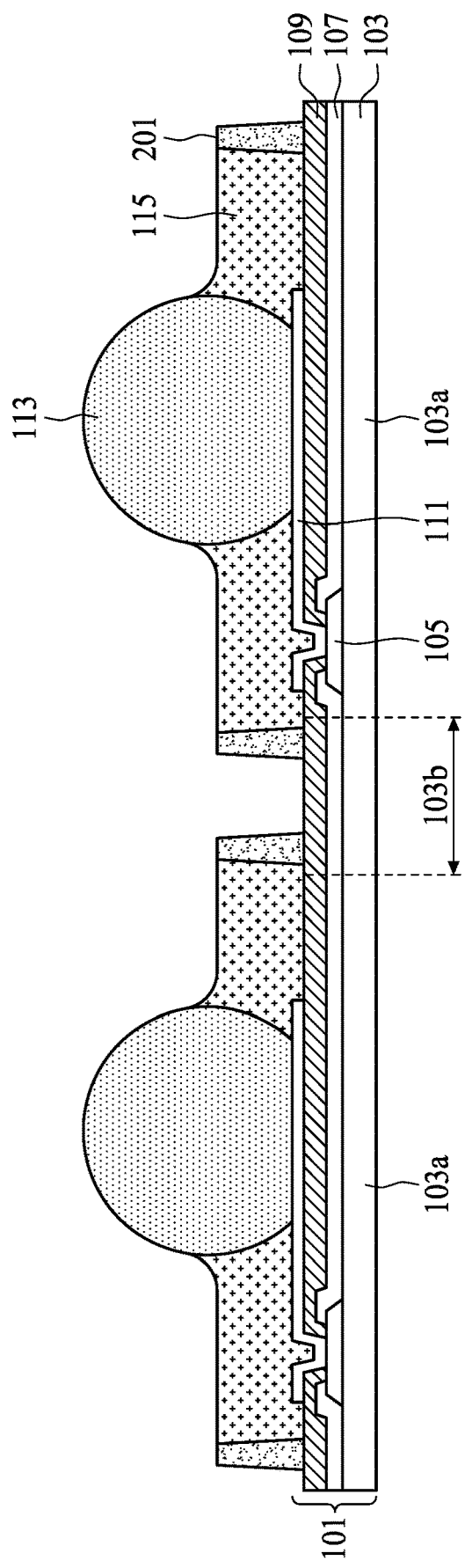
FIG. 4M is a cross-sectional view along a cross-sectional line 2-2 in FIG. 4L in accordance with some embodiments.

FIG. 4L is a top view showing four adjacent dies 103a separated by scribe lines 103b in FIG. 4A, and FIG. 4M is a cross-sectional view along a cross-sectional line 2-2 in FIG. 4L. Referring to FIG. 4L and FIG. 4M, in operation 709, after the formation of the molding 115, a descum process is performed to remove any residual cured molding compound from the surfaces of the bumps 113. In some embodiments, during the descum process, the surfaces of the bumps 113 are cleaned using a laser so as to remove any residual cured molding compound from the surfaces of the bumps 113. In some embodiments, the laser cleaning of the bumps 113 is conducted with a UV laser.

Figure 4N:
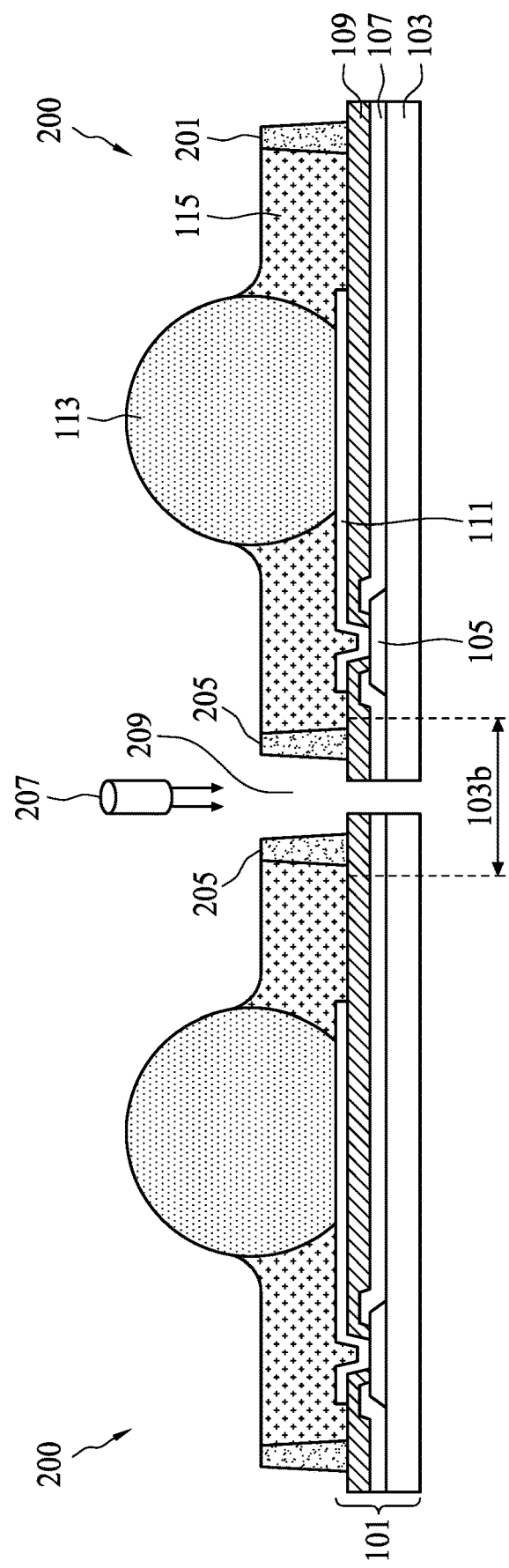
FIG. 4N is a schematic view of a substrate cut into separated dies from a recess adjacent to a retainer in accordance with some embodiments.

Referring to FIG. 4N, in operation 710, the substrate 101 is cut into separated dies 103a from a recess 209 adjacent to the retainer 201. In some embodiments, two adjacent blocking rings 205 form the recess 209 over the scribe line 103b. In some embodiments, these dies 103a are separated through a die cutting or singulation process in which, typically, a mechanical or laser saw is used to cut through the substrate between individual chips or dies. In some embodiments, the laser sawing uses an Argon (Ar) based ion laser beam tool 207.

The molding 115 shrinks and expands when heated and cooled, e.g. during thermal cycling tests, and the shrinking and expansion will create stress on the substrate 101, especially for large die because of the large DNP (the distances to neutral point). Without the use of the retainer 201, the molding 115 would form a continuous matrix extending all the way across the substrate 101. Such a continuous matrix can create a substantial stress that is believed to cause a warp of the substrate 101 and cracks propagating in the substrate 101 during the thermal cycling tests. By using the retainer 201, the molding 115 is formed between the bumps 113 and the retainer 201 locally, rather than forming a continuous matrix. Consequently, the warp and cracks of the substrate 101 are effectively reduced or eliminated.

In addition, without the use of the retainer 201, the molding 115 would be formed on the scribe lines 103b, i.e., the scribe lines 103b would be shadowed, increasing the difficulty for aligning the mechanical or laser saw with the scribe lines 103b during the die cutting or singulation process. In contrast, since there is no molding material on the scribe lines 103b, i.e., the scribe lines 103b are exposed rather than being shadowed, and the alignment of the mechanical or laser saw can be easily carried out. Furthermore, since there is no molding material on the scribe lines 103b, the laser saw is workable during the die cutting or singulation process.

Figure 5:
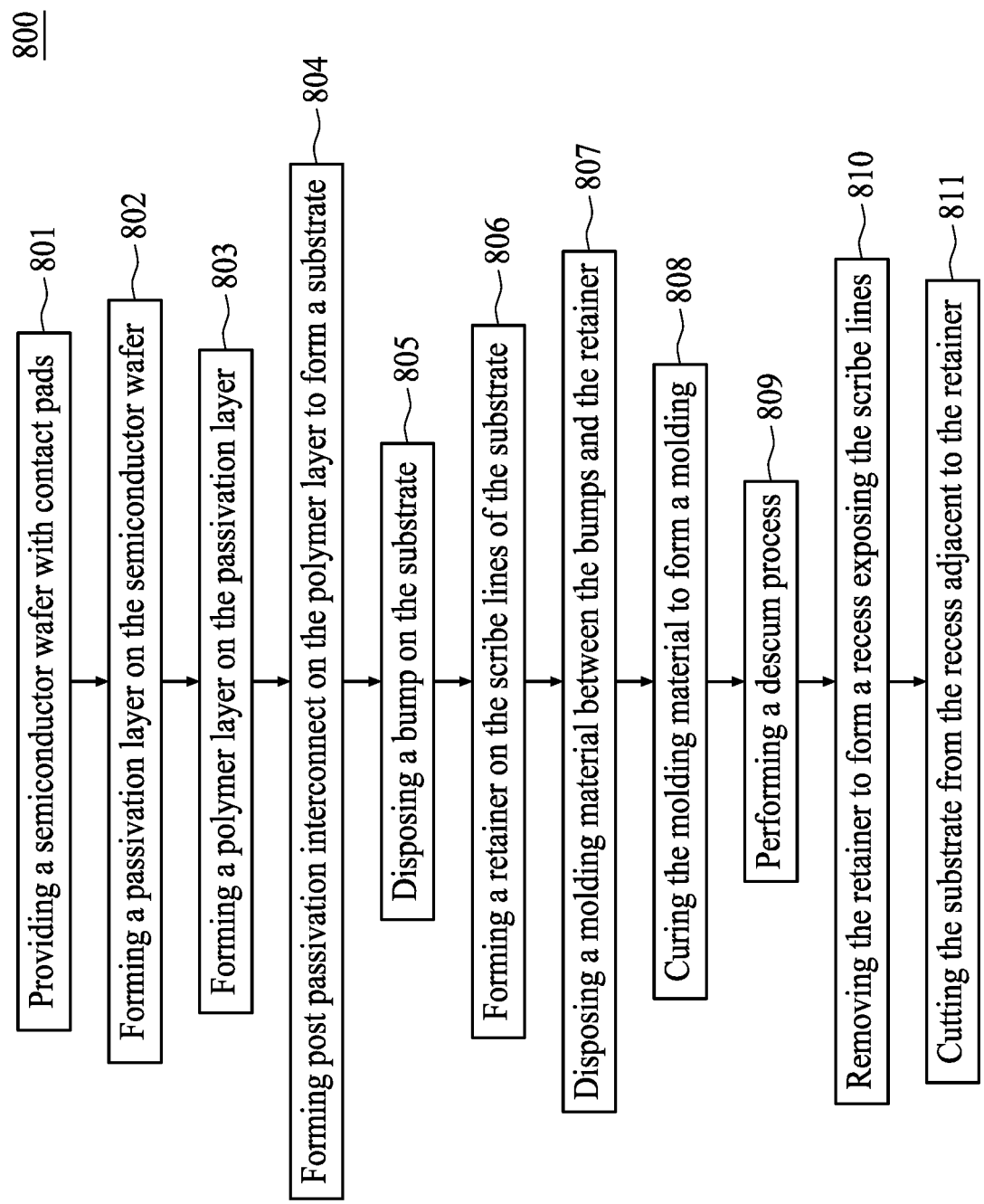
FIG. 5 is a flow chart of a method for manufacturing a semiconductor device in finer detail in accordance with some embodiments.

FIG. 5 is a flow chart of a method 800 for manufacturing a semiconductor device 100 shown in FIG. 1A in accordance with some embodiments. The method 800 includes a number of operations 801, 802, 803, 804, 805, 806, 807, 808, 809, 810, 811, wherein the operations 801, 802, 803, 804, 805 are the same as the operations 701, 702, 703, 704, 705.

Figure 5A:
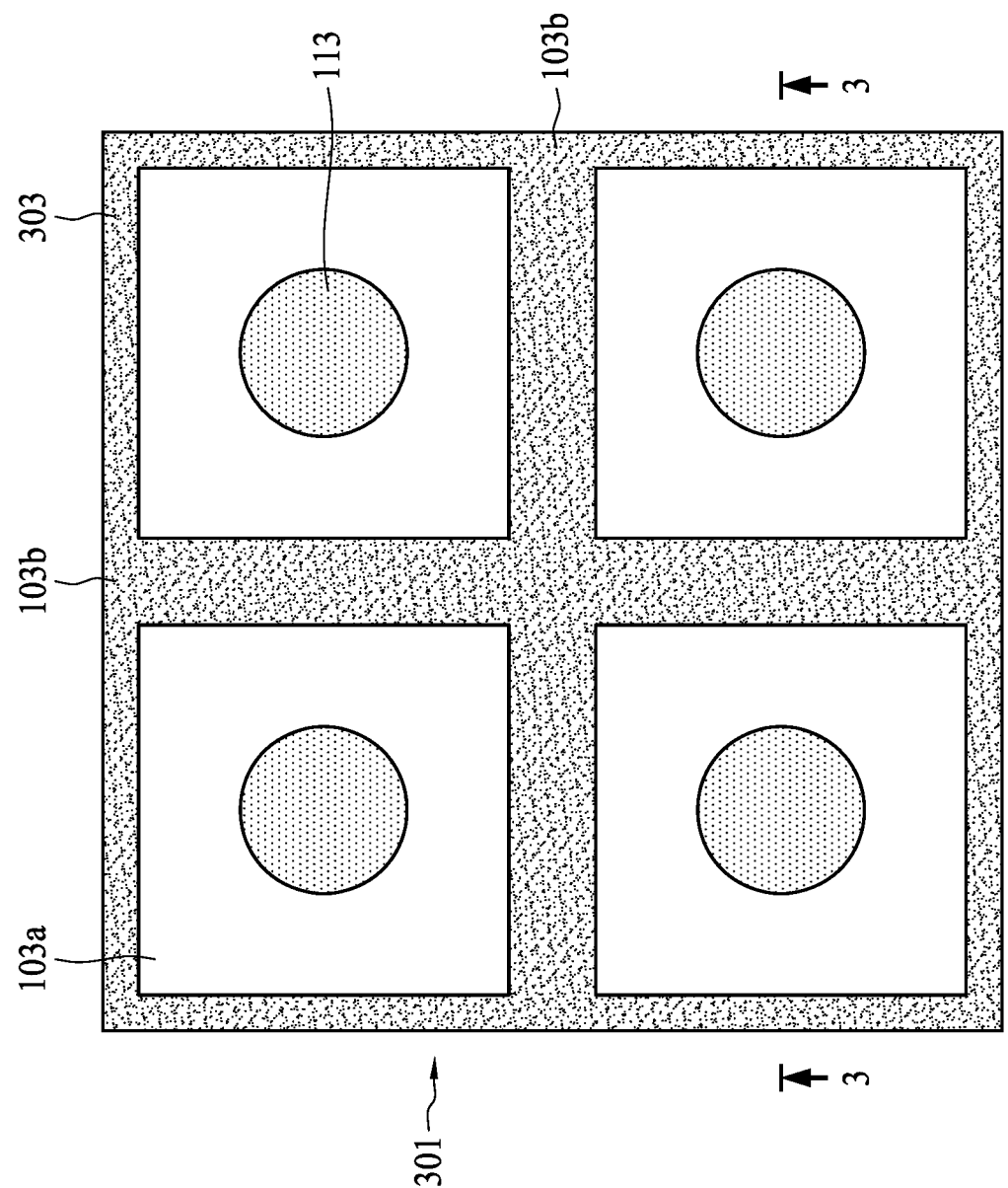
FIG. 5A is a top view of a retainer formed on a substrate in accordance with some embodiments.
Figure 5B:
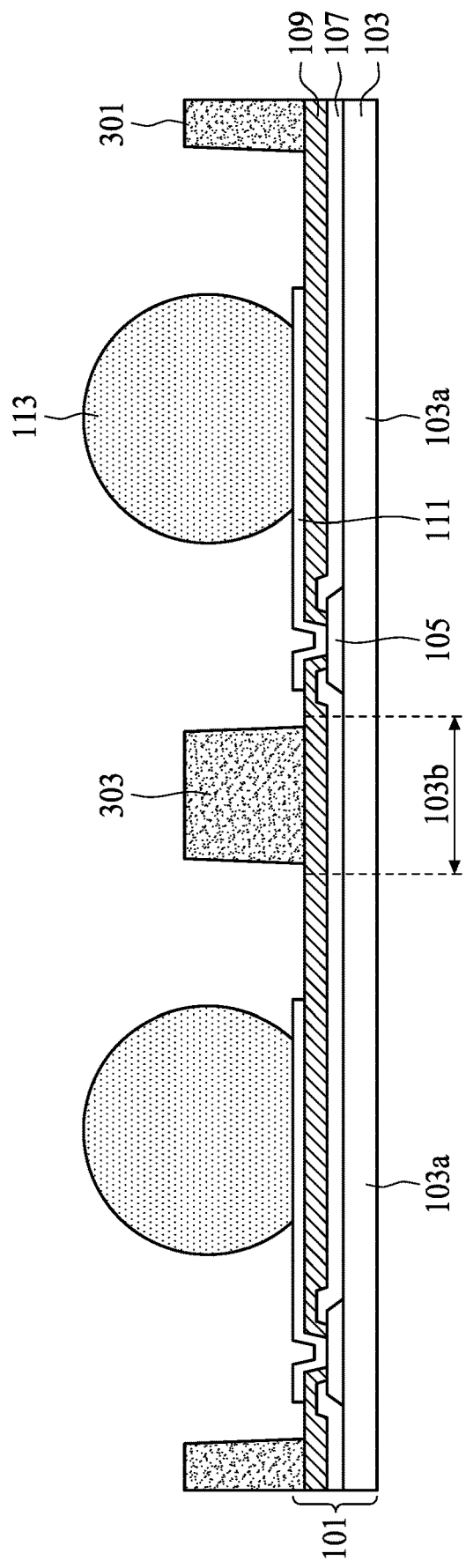
FIG. 5B is a cross-sectional view along a cross-sectional line 3-3 in FIG. 5A in accordance with some embodiments.

FIG. 5A is a top view showing four adjacent dies 103a separated by scribe lines 103b, and FIG. 5B is a cross-sectional view along a cross-sectional line 3-3 in FIG. 5A. Referring to FIG. 5A and FIG. 5B, after performing the operations 801, 802, 803, 804, 805; in operation 806, a retainer 301 is formed on the polymer layer 109 of the substrate 101. In some embodiments, the retainer 301 includes several blocking walls 303 disposed over the scribe lines 103b.

In some embodiments, a mask-defined photoresist etching process is performed to form the blocking walls 303 of the retainer 301, wherein the blocking walls 303 surrounds the bump 113. In some embodiments, the mask-defined photoresist etching process includes a resist-coating process, a baking process to drive out the volatile compounds in the resist and solidifying the resist, and a developing process to strip the non-solidified resist.

Figure 5C:
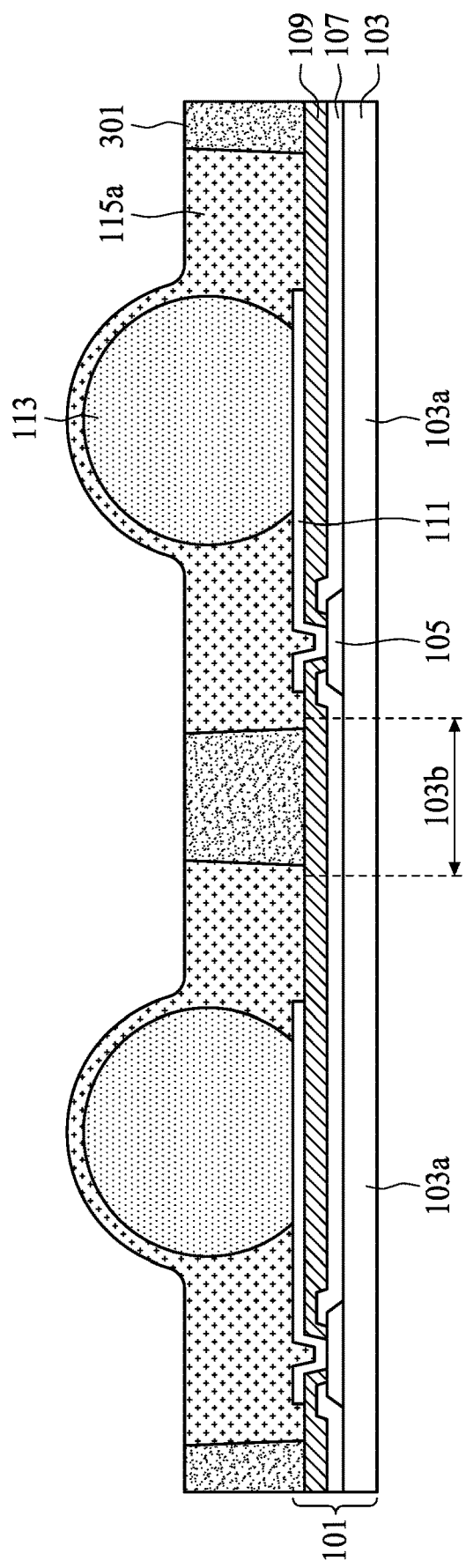
FIG. 5C is a schematic view of a liquid molding material dispensed on a substrate in accordance with some embodiments.

Referring to FIG. 5C, in operation 807, a liquid molding material 115a is dispensed on the substrate 101, wherein the liquid molding material 115a is a liquid underfill that flows beneath the bump 113 by capillary action. In some embodiments, the liquid molding compound 115a surrounds the bump 113. In some embodiments, the liquid molding compound 115a is disposed between the bumps 113 and the blocking walls 303 of the retainer 301.

Figure 5D:
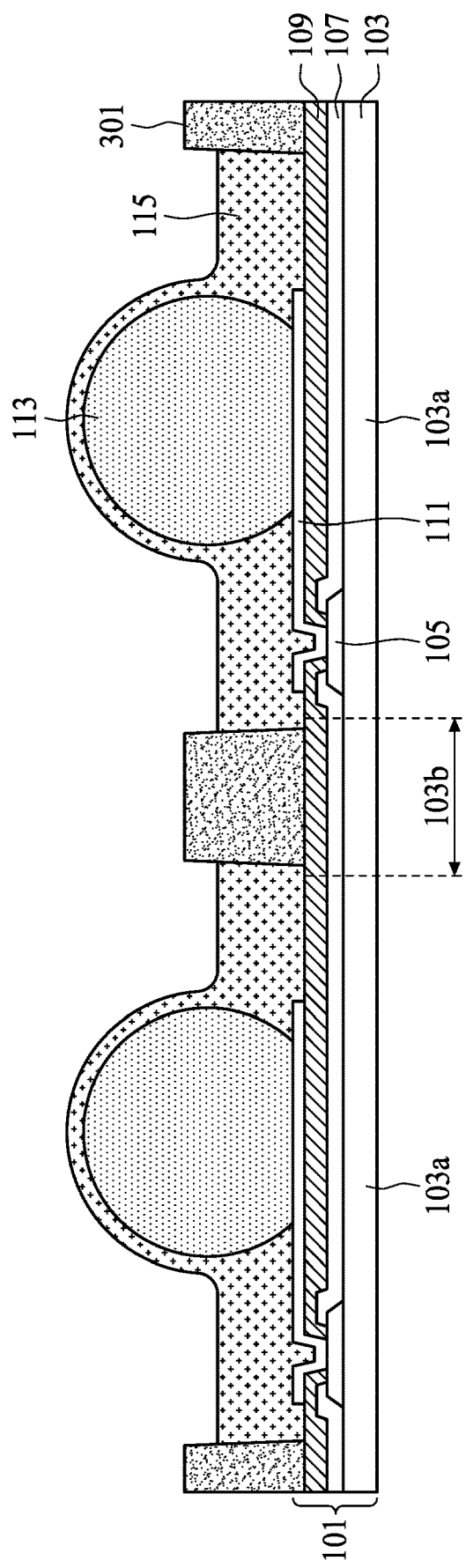
FIG. 5D is a schematic view of a curing process performed to drive out the volatile compounds in a liquid molding material in accordance with some embodiments.

Referring to FIG. 5D, in operation 808, a curing process is performed to drive out the volatile compounds, such as moisture or other organic compounds with low evaporation temperature, in the liquid molding material 115a so as to convert the liquid molding material 115a into a solid and supportive molding 115.

Figure 5E:
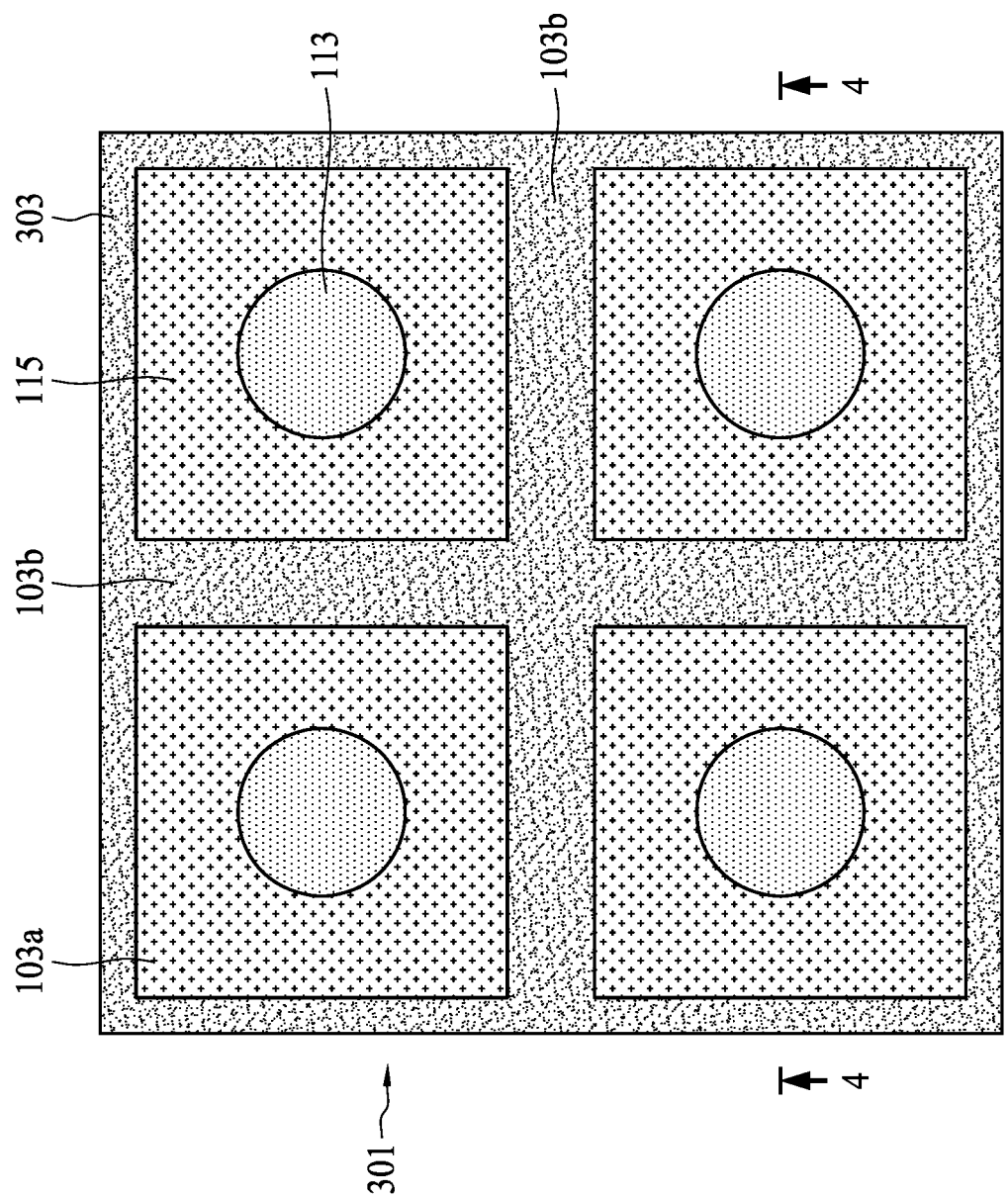
FIG. 5E is a top view of four adjacent dies separated by scribe lines in accordance with some embodiments.
Figure 5F:
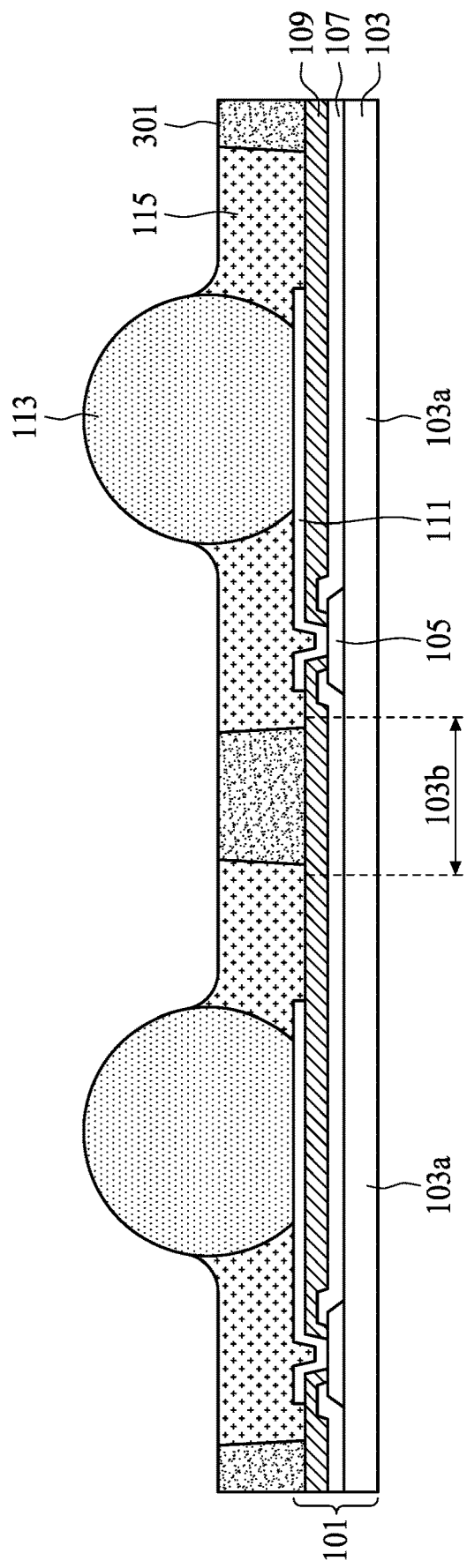
FIG. 5F is a cross-sectional view along a cross-sectional line 4-4 in FIG. 5E in accordance with some embodiments.

FIG. 5E is a top view showing four adjacent dies 103a separated by scribe lines 103b, and FIG. 5F is a cross-sectional view along a cross-sectional line 4-4 in FIG. 5E. Referring to FIG. 5E and FIG. 5F, in operation 809, after the formation of the molding 115, a descum process is performed to remove any residual cured molding compound from the surfaces of the bumps 113.

Figure 5G:
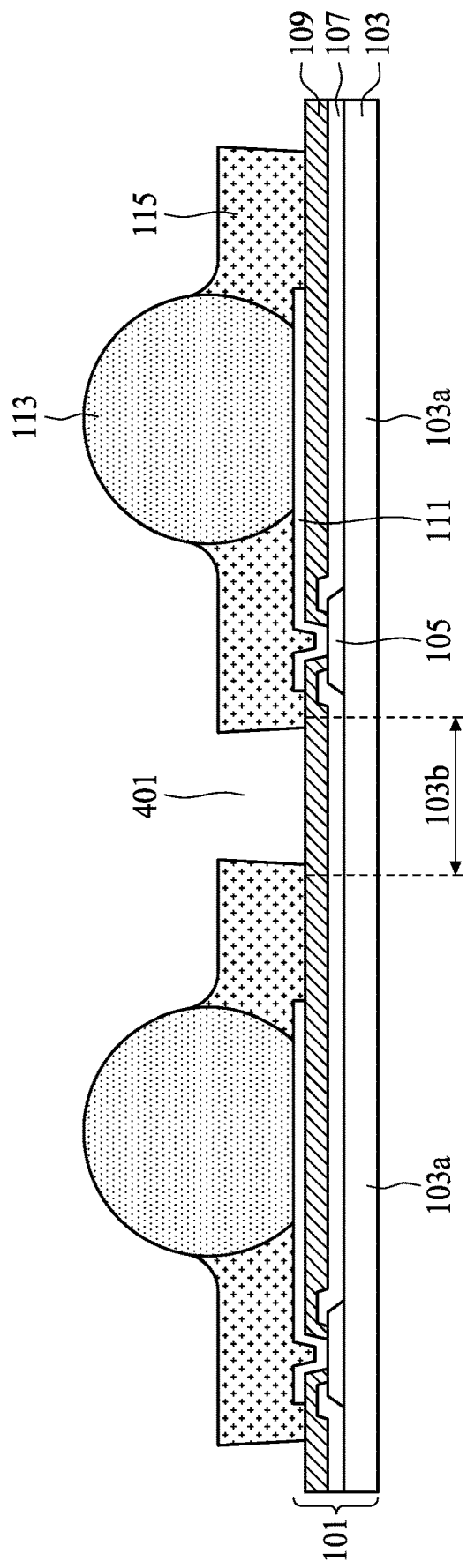
FIG. 5G is a schematic view of a retainer removed to form a recess separating two adjacent moldings from each other in accordance with some embodiments.

Referring to FIG. 5G, in operation 810, the retainer 301 is removed to form a recess 401 separating two adjacent moldings 115 from each other. In some embodiments, the retainer 301 is formed of photoresist, and the removal of the retainer 301 is performed using wet etching, dry etching, or the combination thereof in order to form the recess 401. In wet etching, an etchant includes organic solvents, such as acetone and phenol base compounds or an inorganic solution of sulfuric acid and hydrogen peroxide. In dry etching, oxygen plasma is widely used in the stripping of the photoresist.

Figure 5H:
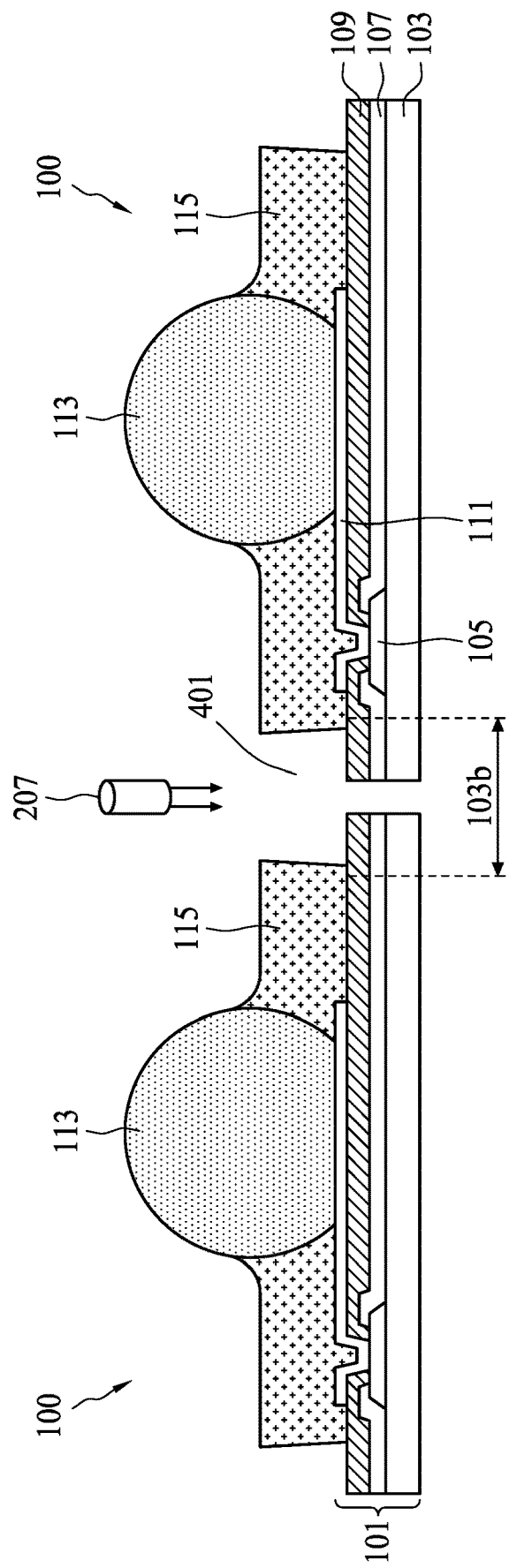
FIG. 5H is a schematic view of a substrate cut into separated dies from a recess separating two adjacent moldings in accordance with some embodiments.

Referring to FIG. 5H, in operation 811, the substrate 101 is cut into separated dies 103a from the recess 401 separating two adjacent moldings 115. In some embodiments, these dies 103a are separated through a die cutting or singulation process in which, typically, a mechanical or laser saw is used to cut through the wafer between individual chips or dies. In some embodiments, the laser sawing uses an Argon (Ar) based ion laser beam tool 207.

Without the use of the retainer 301, the molding 115 would form a continuous matrix extending all the way across the substrate 101. Such a continuous matrix can create a substantial stress that is believed to cause a warp of the substrate and cracks propagating in the substrate 101 during thermal cycling tests. The molding 115 shrinks and expands when heated and cooled during thermal cycling tests, and the shrinking and expansion will create stress on the substrate, especially for large die because of the large DNP (the distances to neutral point). After the molding 115 is formed, the retainer 301 is removed to form the protruded portion 109a of the second layer 109, such that the molding 115 does not cover the entire upper surface of the substrate 101. Consequently, the warp and cracks of the substrate 101 is effectively reduced or eliminated.

In addition, without the use of the retainer 301, the molding 115 would be formed on the scribe lines 103b, i.e., the scribe lines 103b would be shadowed, increasing the difficulty for aligning the mechanical or laser saw with the scribe lines 103b during the die cutting or singulation process. The retainer 301 prevents the molding 115 from being formed on the scribe lines 103b. After the molding 115 is formed, the retainer 301 is removed to expose the scribe lines 103b. Consequently, the alignment of the mechanical or laser saw can be easily carried out. Furthermore, since there is no molding material on the scribe lines 103b, the laser saw is workable during the die cutting or singulation process.

In conclusion, in some embodiments, the semiconductor device includes a retainer or a protruded portion configured to prevent the molding from covering the entire surface of the substrate or forming a continuous matrix extending all the way across the substrate, so as to avoid creating a warp of the substrate and cracks propagating in the substrate during thermal cycling tests. Consequently, the warp and cracks of the substrate is effectively reduced or eliminated during thermal cycling tests. In addition, by using the retainer to prevent the molding from forming over scribe lines so as to allow the scribe lines to be exposed rather than shadowed, the alignment of the mechanical or laser saw can be easily carried out. Furthermore, since there is no molding material on the scribe lines, the laser saw is workable during the die cutting or singulation process.

In some embodiments, a semiconductor device includes a substrate including a first layer and a second layer over the first layer, a bump disposed over the second layer, and a molding disposed over the second layer and surrounding the bump, wherein the second layer includes a protruded portion protruding from a sidewall of the molding adjacent to a periphery of the substrate.

In some embodiments, a semiconductor device includes a substrate including a first layer and a second layer over the first layer, a bump disposed over the second layer, a molding disposed over the second layer and surrounding the bump, and a retainer disposed over the second layer, wherein the retainer is disposed between the molding and a periphery of the substrate.

In some embodiments, a method of manufacturing a semiconductor device includes providing a substrate including a first layer and a second layer over the first layer, disposing several of bumps on the second layer, disposing a retainer on the second layer and surrounding the plurality of bumps, and disposing a molding between the bumps and the retainer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate including a first layer and a second layer over the first layer;
a bump disposed over the second layer; and
a molding disposed over the second layer and surrounding the bump, wherein the second layer includes a protruded portion protruding from a sidewall of the molding adjacent to a periphery of the substrate, and the molding is in contact with at least a portion of the bump.

2. The semiconductor device of claim 1, wherein the first layer includes a protruded portion protruding from the sidewall of the molding adjacent to the periphery of the substrate.

3. The semiconductor device of claim 1, wherein a sidewall of the second layer is aligned with a sidewall of the first layer adjacent to the periphery of the substrate.

4. The semiconductor device of claim 1, wherein the molding has an inclined sidewall adjacent to the periphery of the substrate.

5. The semiconductor device of claim 1, wherein an included angle of the sidewall of the molding and an upper surface of the molding is smaller than ninety degrees.

6. A semiconductor device, comprising:
a substrate including a first layer and a second layer over the first layer;
a bump disposed over the second layer;
a molding disposed over the second layer and surrounding the bump; and
a retainer disposed over the second layer, wherein the retainer is disposed between the molding and a periphery of the substrate, and the molding is in contact with at least a portion of the bump.

7. The semiconductor device of claim 6, wherein the retainer includes a blocking ring surrounding the molding.

8. The semiconductor device of claim 6, wherein the retainer includes a plurality of blocking walls adjacent to the periphery of the substrate.

9. The semiconductor device of claim 6, wherein a top end of the retainer is lower than or equal to a top end of the bump.

10. The semiconductor device of claim 6, wherein the retainer has a trapezoidal cross-section.

11. The semiconductor device of claim 6, wherein the retainer has an inclined sidewall adjacent to the periphery of the substrate.

12. The semiconductor device of claim 6, wherein an included angle of a sidewall of the retainer and an upper surface of the retainer is larger than ninety degrees.

13. The semiconductor device of claim 6, wherein the second layer includes a protruded portion protruding from a sidewall of the retainer adjacent to the periphery of the substrate.

14. A semiconductor device, comprising:
a substrate;
a bump disposed over the substrate;
a molding disposed over the substrate and surrounding the bump; and
a retainer disposed over the substrate, wherein the retainer is disposed between the molding and a periphery of the substrate, and the molding is in contact with at least a portion of the bump.

15. The semiconductor device of claim 14, wherein the retainer includes a blocking ring surrounding the molding.

16. The semiconductor device of claim 14, wherein the retainer includes a plurality of blocking walls adjacent to the periphery of the substrate.

17. The semiconductor device of claim 14, wherein a top end of the retainer is lower than or equal to a top end of the bump.

18. The semiconductor device of claim 14, wherein the retainer has a trapezoidal cross-section.

19. The semiconductor device of claim 14, wherein the retainer has an inclined sidewall adjacent to the periphery of the substrate.

20. The semiconductor device of claim 14, wherein an included angle of a sidewall of the retainer and an upper surface of the retainer is larger than ninety degrees.

* * * * *